United States Patent
Jang et al.

(10) Patent No.: US 11,720,143 B2
(45) Date of Patent: Aug. 8, 2023

(54) ADHESIVE MEMBER, DISPLAY DEVICE INCLUDING THE SAME, AND METHOD OF FABRICATING DISPLAY DEVICE

(71) Applicant: Samsung Display Co., Ltd., Yongin-Si (KR)

(72) Inventors: Daehwan Jang, Seoul (KR); Hyun a Lee, Seoul (KR); Chan-Jae Park, Suwon-si (KR); Sunok Oh, Hwaseong-si (KR); Kikyung Youk, Bucheon-si (KR); Sangduk Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 318 days.

(21) Appl. No.: 17/019,830

(22) Filed: Sep. 14, 2020

(65) Prior Publication Data
US 2021/0223818 A1    Jul. 22, 2021

(30) Foreign Application Priority Data

Jan. 20, 2020    (KR) .................. 10-2020-0007408

(51) Int. Cl.
  *B32B 3/30*    (2006.01)
  *G06F 1/16*    (2006.01)
  *G02B 1/14*    (2015.01)
  *B32B 3/06*    (2006.01)

(52) U.S. Cl.
  CPC .............. *G06F 1/1609* (2013.01); *B32B 3/06* (2013.01); *G02B 1/14* (2015.01); *B32B 2405/00* (2013.01); *B32B 2457/206* (2013.01)

(58) Field of Classification Search
  CPC .. B32B 3/06; B32B 3/085; B32B 3/26; B32B 3/263; B32B 3/30
  See application file for complete search history.

(56) References Cited

U.S. PATENT DOCUMENTS

| 4,626,961 | A | 12/1986 | Ono et al. |
| 10,023,775 | B2 | 7/2018 | Kawamoto et al. |
| 2010/0193234 | A1 | 8/2010 | Kisban et al. |
| 2010/0321916 | A1 | 12/2010 | Yoshida |
| 2018/0174952 | A1 | 6/2018 | Kim et al. |
| 2019/0096979 | A1 * | 3/2019 | Jo .......................... H05K 1/118 |

FOREIGN PATENT DOCUMENTS

| EP | 2053647 A2 | 4/2009 |
| JP | 2007141963 A | 6/2007 |
| KR | 100601762 B1 | 7/2006 |
| KR | 1020170113552 A | 10/2017 |
| KR | 1020180070774 A | 6/2018 |
| KR | 1020210043790 A | 4/2021 |
| WO | 0220686 A2 | 3/2002 |

* cited by examiner

*Primary Examiner* — Elizabeth E Mulvaney
(74) *Attorney, Agent, or Firm* — Cantor Colburn LLP

(57) ABSTRACT

An adhesive member is between an electronic component and an electronic panel that are connected to each other through the adhesive member. The adhesive member has a second surface and a first surface. The adhesive member includes a first recess pattern recessed from the first surface and a second recess pattern recessed from the first surface. The second recess pattern is spaced apart in a first direction from the first recess pattern. A sum of a planar area of the first recess pattern and a planar area of the second recess pattern ranges from about 20 percent (%) to about 70% of a planar area of the first surface.

20 Claims, 17 Drawing Sheets

ADHESIVE MEMBER, DISPLAY DEVICE INCLUDING THE SAME, AND METHOD OF FABRICATING DISPLAY DEVICE

This application claims priority to Korean Patent Application No. 10-2020-0007408, filed on Jan. 20, 2020, and all the benefits accruing therefrom under 35 U.S.C. § 119, the content of which in its entirety is herein incorporated by reference.

BACKGROUND

1. Field

Embodiments of the invention relate to a display device, and more particularly, to an adhesive member that connects an electronic component and a display panel to each other, a display device including the same, and a method of fabricating the display device.

2. Description of the Related Art

A variety of display devices used for multimedia apparatuses, such as televisions, mobile phones, tablet computers, navigation systems, and game consoles, is being developed.

The display device includes a display panel that displays an image. The display panel includes a plurality of gate lines, a plurality of data lines, and a plurality of pixels connected to the plurality of gate lines and the plurality of data lines. The display device may include an electronic component that provides the gate lines or the data lines with electrical signals desired for displaying the image.

The electronic component may be electrically connected to the display panel by an anisotropic conductive film or by an ultrasonic bonding method. Compared to using the anisotropic conductive film, the ultrasonic bonding method may increase conductivity and simplify process procedures for a connection between the display panel and the electronic component.

SUMMARY

Some embodiments of the invention provide an adhesive member capable of increasing joint reliability between an electronic component and a display panel, a display device including the same, and a method of fabricating the display device.

An embodiment of the invention provides an adhesive member between an electronic component and an electronic panel that are connected to each other through the adhesive member. The adhesive member includes a second surface and a first surface opposite to each other. The adhesive member defines a first recess pattern recessed from the first surface and a second recess pattern recessed from the first surface. The second recess pattern is spaced apart in a first direction from the first recess pattern. A sum of a planar area of the first recess pattern and a planar area of the second recess pattern ranges from about 20 percent (%) to about 70% of a planar area of the first surface.

In an embodiment, a height of the first recess pattern recessed from the first surface may be different from a height of the second recess pattern recessed from the first surface.

In an embodiment, in a plan view, an area of the first recess pattern may be different from an area of the second recess pattern.

In an embodiment, each of the first and second recess patterns may have a shape that extends along a second direction perpendicular to the first direction.

In an embodiment, the first recess pattern may include a plurality of first sub-recess patterns that are recessed from the first surface and are arranged at a first interval along a second direction perpendicular to the first direction. The second recess pattern may include a plurality of second sub-recess patterns that are recessed from the first surface and are arranged at a second interval along the second direction.

In an embodiment, a planar area of one of the plurality of second sub-recess patterns may be greater than a planar area of each of the plurality of first sub-recess patterns.

In an embodiment, the second interval may be greater than the first interval.

In an embodiment, the adhesive member may include a thermal initiator. The adhesive member may have non-conductive characteristics and may surround the electronic component.

In an embodiment, the first recess pattern may include a first sub-recess pattern that extends in a second direction perpendicular to the first direction, and a second sub-recess pattern that is parallel to the second direction.

An embodiment of the invention provides a display device including a base substrate on which are defined a display area and a non-display area adjacent to the display area, the non-display area including a first pad area, a second pad area, and a non-pad area between the first and second pad areas, a plurality of first pads on the base substrate, the plurality of first pads overlapping the first pad area, a plurality of second pads on the base substrate, the plurality of second pads overlapping the second pad area, an electronic component that includes a plurality of first bumps in electrical contact with corresponding first pads of the plurality of first pads, a plurality of second bumps in electrical contact with corresponding second pads of the plurality of second pads, and a substrate on which the first bumps and the second bumps are disposed, the electronic component and the base substrate facing each other in a thickness direction of the base substrate, and a first adhesive member between the base substrate and the electronic component. An inner space is defined by the substrate, the first adhesive member, and two neighboring ones of the first bumps that overlap the first pad area.

In an embodiment, the first pad area and the second pad area may be spaced apart in a first direction across the non-pad area. The first pads may be arranged along a second direction perpendicular to the first direction. The second pads may be arranged along the second direction.

In an embodiment, the plurality of first pads may be arranged along the second direction at a first interval. The plurality of second pads may be arranged along the second direction at a second interval. The second interval may be greater than the first interval.

In an embodiment, one of the plurality of second pads has a planar area greater than a planar area of each of the plurality of first pads.

In an embodiment, the first adhesive member may partially cover at least one of the first bumps and the second bumps.

In an embodiment, the display device may further include a plurality of connection pads that are spaced apart from the electronic component in a plan view and are disposed on the base substrate, the plurality of connection pads overlapping the non-display area, a circuit board that overlaps the non-display area and includes a plurality of circuit pads in electrical contact with corresponding connection pads of the plurality of connection pads, and a second adhesive member between the circuit board and the base substrate.

In an embodiment, the second adhesive member may partially cover at least one of the plurality of circuit pads.

An embodiment of the invention provides a method of fabricating a display device including providing a display panel and an electronic component, the display panel including a pad, and the electronic component including a bump facing the pad, providing an adhesive member between the display panel and the electronic component, the adhesive member including a first surface and a second surface, defining a recess pattern that is recessed from the first surface of the adhesive member, aligning the adhesive member to allow the recess pattern to overlap the pad and the bump, providing the electronic component with thermal pressure to cause the bump to electrically contact the pad, and providing ultrasonic vibration to an interface between the pad and the bump.

In an embodiment, the adhesive member may define a recess area that overlaps the pad and a non-recess area adjacent to the recess area. When viewed along a thickness direction of the display panel, a thickness of the adhesive member that overlaps the non-display area may be greater than a sum of a height of the pad and a height of the bump.

In an embodiment, a planar area of the recess pattern may fall within a range from about 20% to about 70% of a planar area of the first surface.

In an embodiment, the method may further include defining a sub-recess pattern that is spaced apart in a predetermined direction from the recess pattern and is recessed from the first surface of the adhesive member. When viewed along a thickness direction of the display panel, a height of the recess pattern may be different from a height of the sub-recess pattern.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1A:
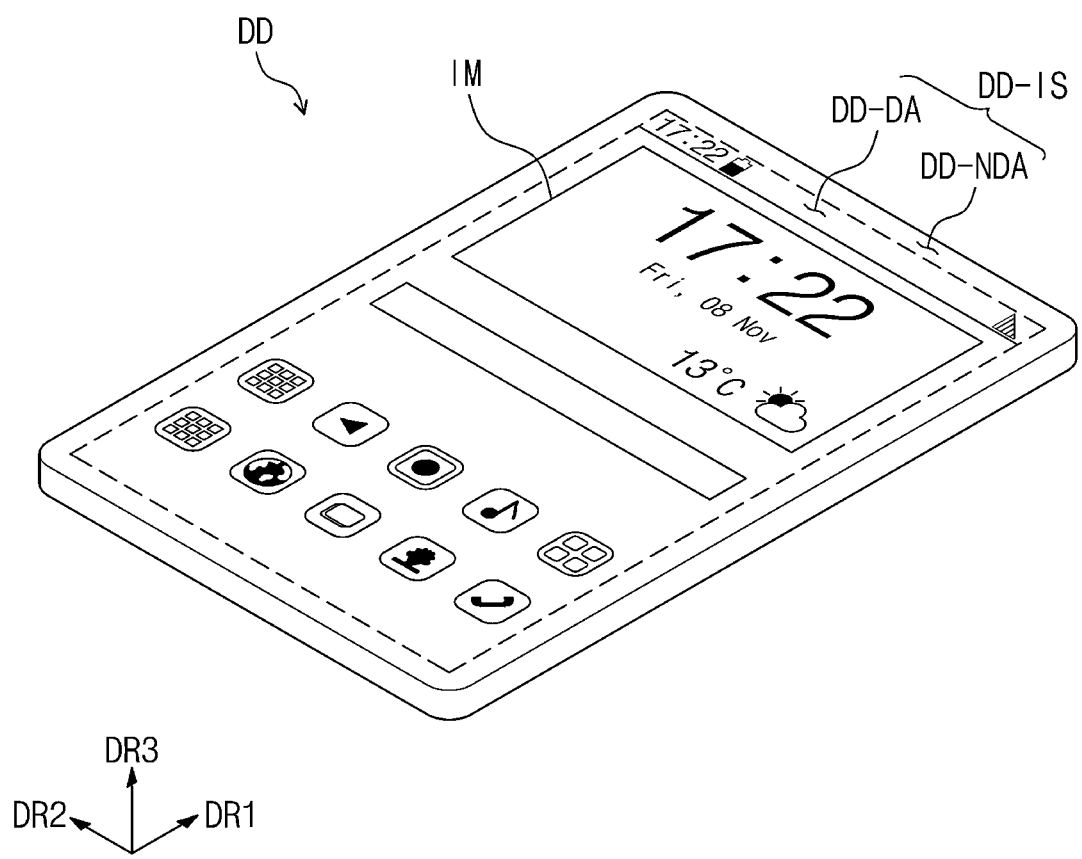
FIG. 1A illustrates a perspective view showing an embodiment of a display device according to the invention.

In this description, when a certain component (or area, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. A first component could be termed a second component, and vice versa without departing from the scope of the invention, for example. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe some embodiments of the invention in conjunction with the accompanying drawings.

Figure 1B:
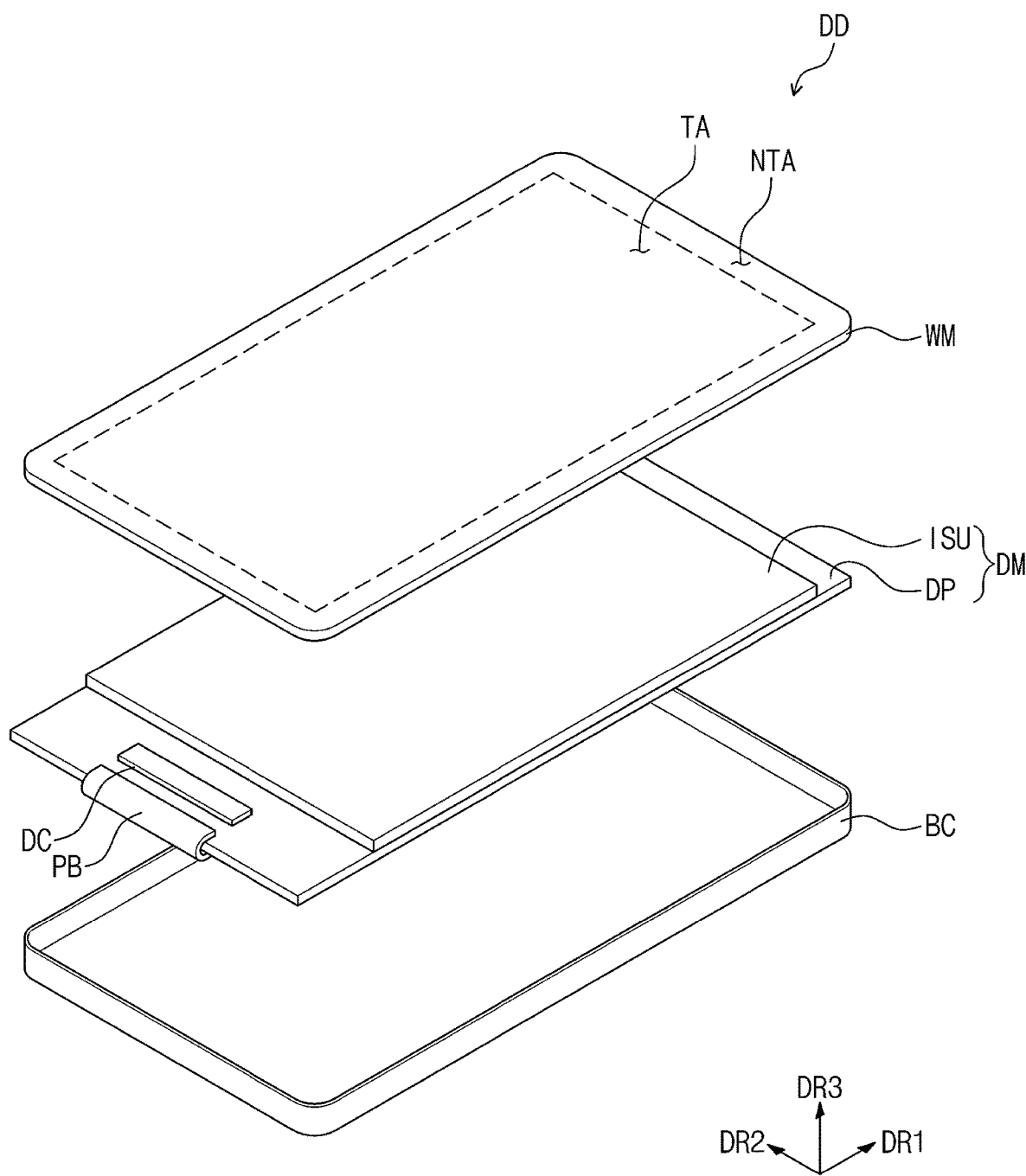
FIG. 1B illustrates an exploded perspective view showing an embodiment of a display device according to the invention.
Figure 2:
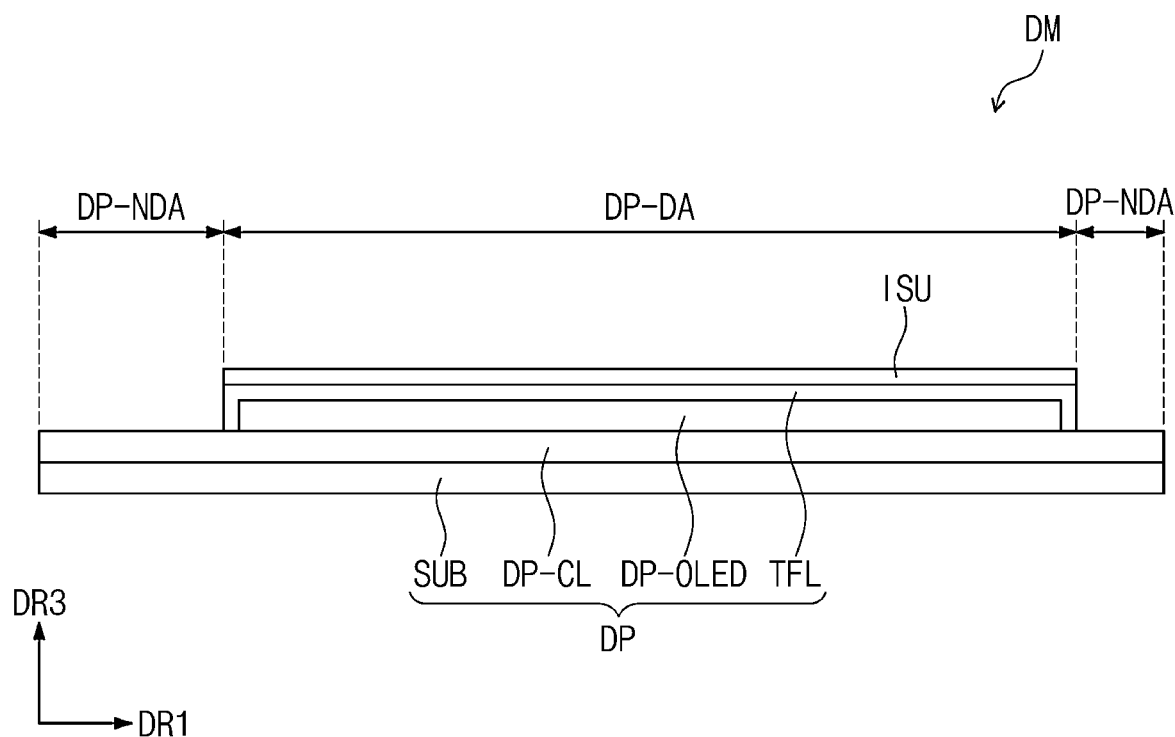
FIG. 2 illustrates a cross-sectional view showing an embodiment of a display module according to the invention.

FIG. 1A illustrates a perspective view showing an embodiment of a display device according to the invention. FIG. 1B illustrates an exploded perspective view showing an embodiment of a display device according to the invention. FIG. 2 illustrates a cross-sectional view showing an embodiment of a display module according to the invention.

In this description, a display device DD is exemplarily illustrated which is suitable for a mobile-phone terminal. Although not shown, the mobile-phone terminal may include the display device DD in a bracket/casing which accommodates a mainboard on which are installed electronic modules, a camera module, a power module, and the like. The display device DD according to the invention may be applicable not only to large-sized electronic products such as television sets and monitors, but also to small and medium-sized electronic products such as tablet computers, automotive navigation systems, game consoles, and smart watches.

Referring to FIG. 1A, the display device DD may display an image IM on a display surface DD-IS. Icons are illustrated as an example of the image IM. The display surface DD-IS is parallel to a plane defined by a first direction DR1 and a second direction DR2. A third direction DR3 indicates a normal direction to the display surface DD-IS, or a thickness direction of the display device DD. In this description, the phrase "a plan view" may mean "a view in the third direction DR3". The third direction DR3 differentiates from each other a front surface (or top surface) and a rear surface (or bottom surface) of each layer or unit which will be described below. Directions indicated by the first, second, and third directions DR1, DR2, and DR3 are relative concepts and may denote respective opposite directions.

The display surface DD-IS includes a display area DD-DA on which the image IM is displayed and a non-display area DD-NDA adjacent to the display area DD-DA. The non-display area DD-NDA is a zone on which no image is displayed. The invention, however, is not limited thereto, and the non-display area DD-NDA may be adjacent to one side of the display area DD-DA or may be omitted.

Referring to FIG. 1B, the display device DD may include a window WM, a display module DM, a driver chip DC, a circuit board PB, and an accommodation member BC. The accommodation member BC may receive the display module DM and may be associated with the window WM.

The window WM may be disposed above the display module DM, and may externally transmit an image IM provided from the display module DM. The window WM includes a transmission area TA and a non-transmission area NTA. The transmission area TA may overlap the display area DD-DA, and may have a shape that corresponds to that of the display area DD-DA. The image IM displayed on the display area DD-DA of the display device DD may be externally visible through the transmission area TA of the window WM.

The non-transmission area NTA may overlap the non-display area DD-NDA, and may have a shape that corresponds to that of the non-display area DD-NDA. The non-transmission area NTA may be a zone having optical transmittance relatively less than that of the transmission area TA. The technical concepts of the invention, however, are not limited thereto, and the non-transmission area NTA may be omitted.

In an embodiment, the window WM may include glass, sapphire, or plastic, for example. Although the window WM is illustrated as a single layer, the window WM may include a plurality of layers. The window WM may include a base layer and at least one printed layer that overlaps the non-transmission area NTA and is disposed on a rear surface of the base layer. The printed layer may have a predetermined color. In an embodiment, the printed layer may have either a black color or any color other than the black color, for example.

The display module DM is disposed between the window WM and the accommodation member BC. The display module DM includes a display panel DP and an input sensing layer ISU. The display panel DP may generate an image IM and may transfer the generated image IM to the window WM.

In some embodiments, the display panel DP may be a light emitting display panel and is not especially limited to a particular type. In an embodiment, the display panel DP may be an organic light emitting display panel or a quantum-dot light emitting display panel, for example. An emission layer of an organic light emitting display panel may include an organic light emitting material. An emission layer of the quantum-dot light emitting display panel may include a quantum-dot or a quantum-rod. The following will describe an example in which an organic light emitting display panel is adopted as the display panel DP.

It is explained below that an organic light emitting display panel is used as the display panel DP according to the invention. The technical concepts of the invention, however, are not limited thereto, and based on embodiments, various types of display panels are applicable to the invention.

Referring to FIG. 2, the display panel DP includes a base substrate SUB and also includes a circuit element layer DP-CL, a display element layer DP-OLED, and a dielectric layer TFL all of which are disposed on the base substrate SUB.

The display panel DP includes a display area DP-DA and a non-display area DP-NDA. The display area DP-DA of the display panel DP corresponds to the display area DD-DA illustrated in FIG. 1A or the transmission area TA illustrated in FIG. 1B, and the non-display area DP-NDA of the display panel DP corresponds to the non-display area DD-NDA illustrated in FIG. 1A or the non-transmission area NTA illustrated in FIG. 1B.

The base substrate SUB may include at least one plastic film. In an embodiment, the base substrate SUB may include a flexible substrate, for example, a plastic substrate, a glass substrate, a metal substrate, or an organic/inorganic composite material substrate.

The circuit element layer DP-CL includes at least one intermediate dielectric layer and a circuit element. The intermediate dielectric layer includes at least one intermediate inorganic layer and at least one intermediate organic layer. The circuit element includes signal lines and a pixel driver circuit.

The display element layer DP-OLED includes a plurality of organic light emitting diodes. The display element layer DP-OLED may further include an organic layer such as a pixel definition layer. In other embodiments, when the display panel DP is provided in the type of a liquid crystal display panel, the display element layer DP-OLED may be provided in the type of a liquid crystal layer.

The dielectric layer TFL encapsulates the display element layer DP-OLED. In an embodiment, the dielectric layer TFL may be a thin-film encapsulation layer, for example. The dielectric layer TFL protects the display element layer DP-OLED against foreign substances such as moisture, oxygen, and dust particles. The invention, however, is not limited thereto, and the dielectric layer TFL may be replaced with an encapsulation substrate. In this case, the encapsulation substrate may stand opposite to the base substrate SUB, and the circuit element layer DP-CL and the display element layer DP-OLED may be disposed between the encapsulation substrate and the base substrate SUB.

The input sensing layer ISU may be disposed between the window WM and the display panel DP. The input sensing layer ISU detects an externally applied input. The externally applied input may be provided in various types. In an embodiment, the externally applied input includes a user's body, a stylus pen, light, heat, pressure, or any various types of external input. In addition, the externally applied input may not only include a user's touch, but may also include an approaching spatial touch (e.g., hovering touch), for example.

The input sensing layer ISU may be directly disposed on the display panel DP. In this description, the phrase "A is directly disposed on B" means that no adhesive layer is disposed between A and B. In the illustrated embodiment, the input sensing layer ISU and the display panel DP may be fabricated in a successive process. The technical concepts of the invention, however, are not limited thereto. The input sensing layer ISU may be provided in the form of an individual panel, and may be coupled through an adhesive layer to the display panel DP. In another embodiment, the input sensing layer ISU may be omitted.

Referring back to FIG. 1B, the driver chip DC may be disposed on the display panel DP, while overlapping the non-display area DP-NDA. In an embodiment, in response to control signals transferred from the circuit board PB, the driver chip DC may generate drive signals desired for operation of the display panel DP, for example. The driver chip DC may transfer the generated drive signals to the circuit element layer DP-CL of the display panel DP. In this description, the driver chip DC may be explained as an electronic component.

In some embodiments, an ultrasonic bonding method may be employed to electrically bond the driver chip DC to the base substrate SUB. In an embodiment, the display panel DP according to the invention may include a pad electrically connected to the display element layer DP-OLED, and the driver chip DC may include a bump in electrical contact with the pad, for example. According to the invention, the pad of the display panel DP and the bump of the driver chip DC may not be indirectly connected to each other through a separate conductive material, but may be directly connected to each other.

The circuit board PB may be disposed at an end of the base substrate SUB and electrically connected to the circuit element layer DP-CL. The circuit board PB may be rigid or flexible. In an embodiment, when the circuit board PB is flexible, the circuit board PB may be provided as a flexible printed circuit board, for example. The circuit board PB may include a timing control circuit that controls operation of the display panel DP. The timing control circuit may be provided in the form of an integrated circuit chip disposed (e.g., mounted) on the circuit board PB. In addition, although not shown, the circuit board PB may include an input sensing circuit that controls the input sensing layer ISU.

In some embodiments, an ultrasonic bonding method may also be employed to electrically bond the circuit board PB to the base substrate SUB of the display panel DP. The following will describe in detail the structure in which the circuit board PB and the driver chip DC are ultrasonically bonded to the base substrate SUB.

Figure 3:
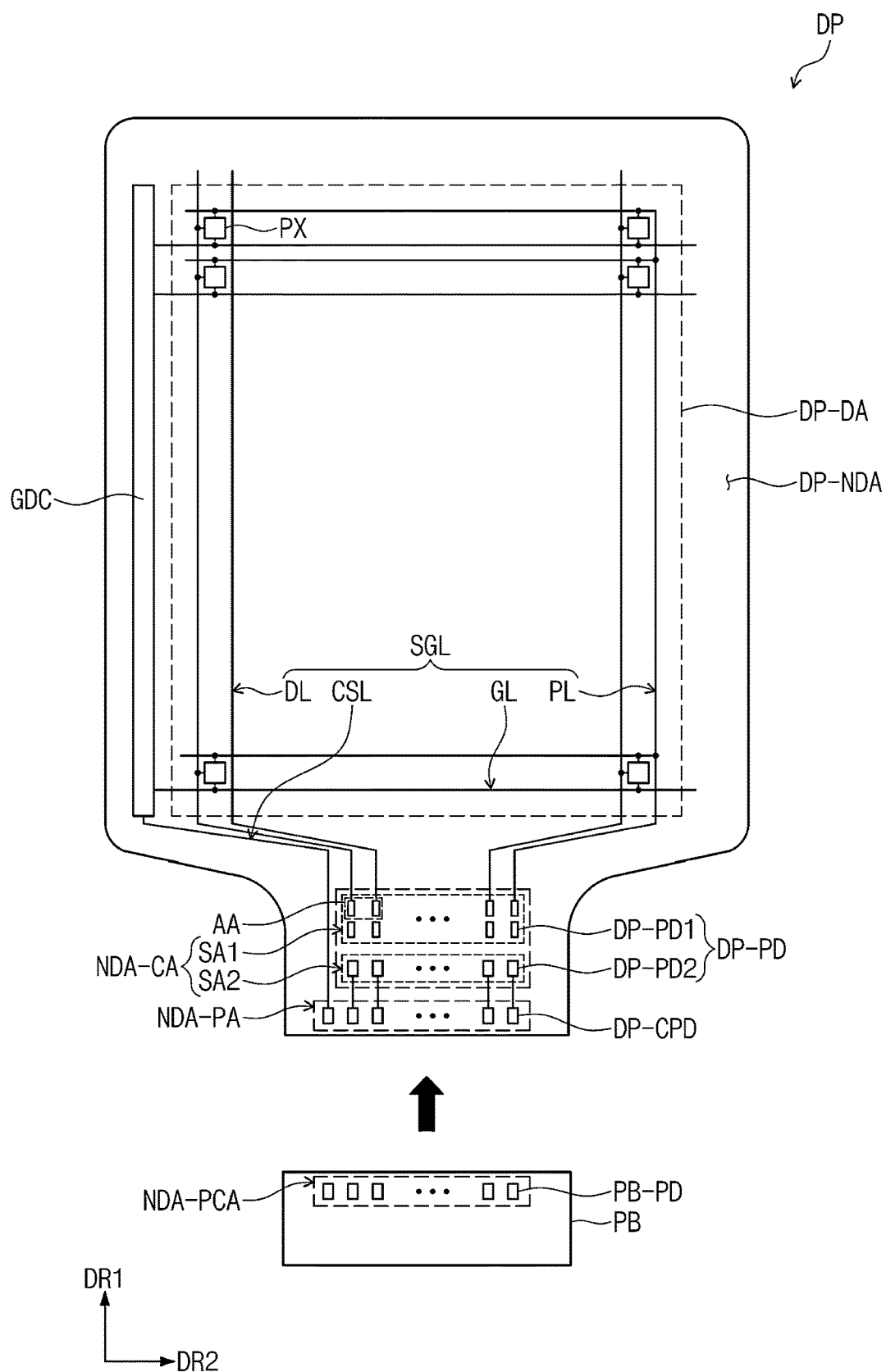
FIG. 3 illustrates a plan view showing an embodiment of a display panel according to the invention.
Figure 4A:
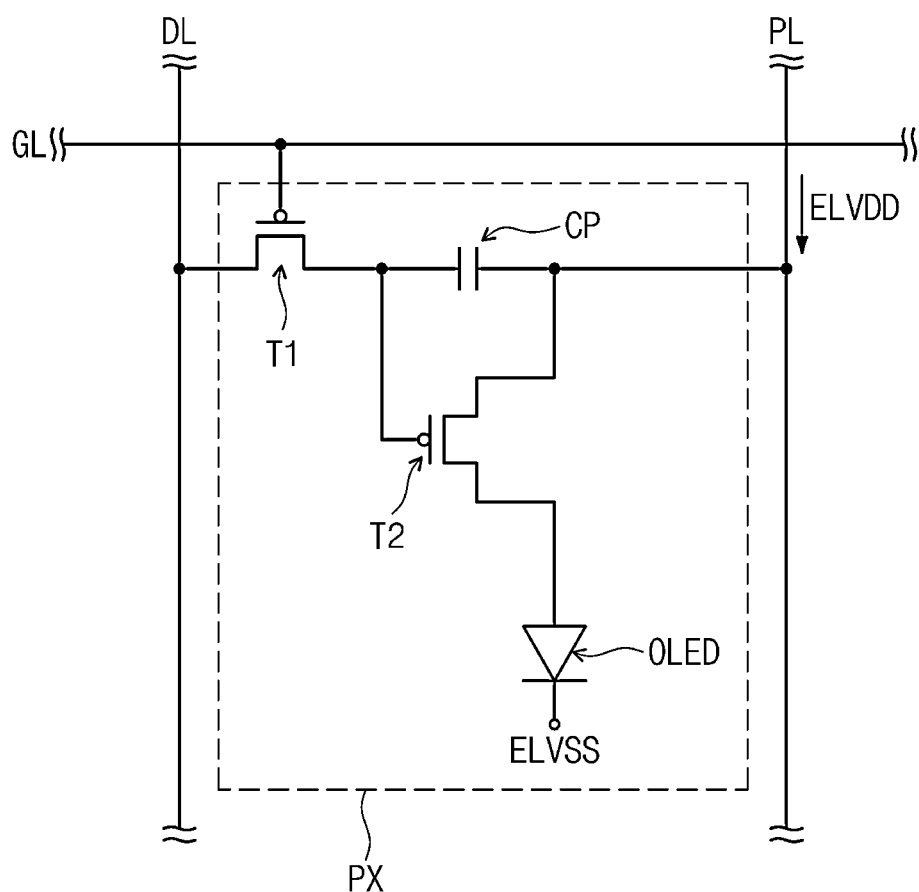
FIG. 4A illustrates an equivalent circuit diagram of a pixel shown in FIG. 3.
Figure 4B:
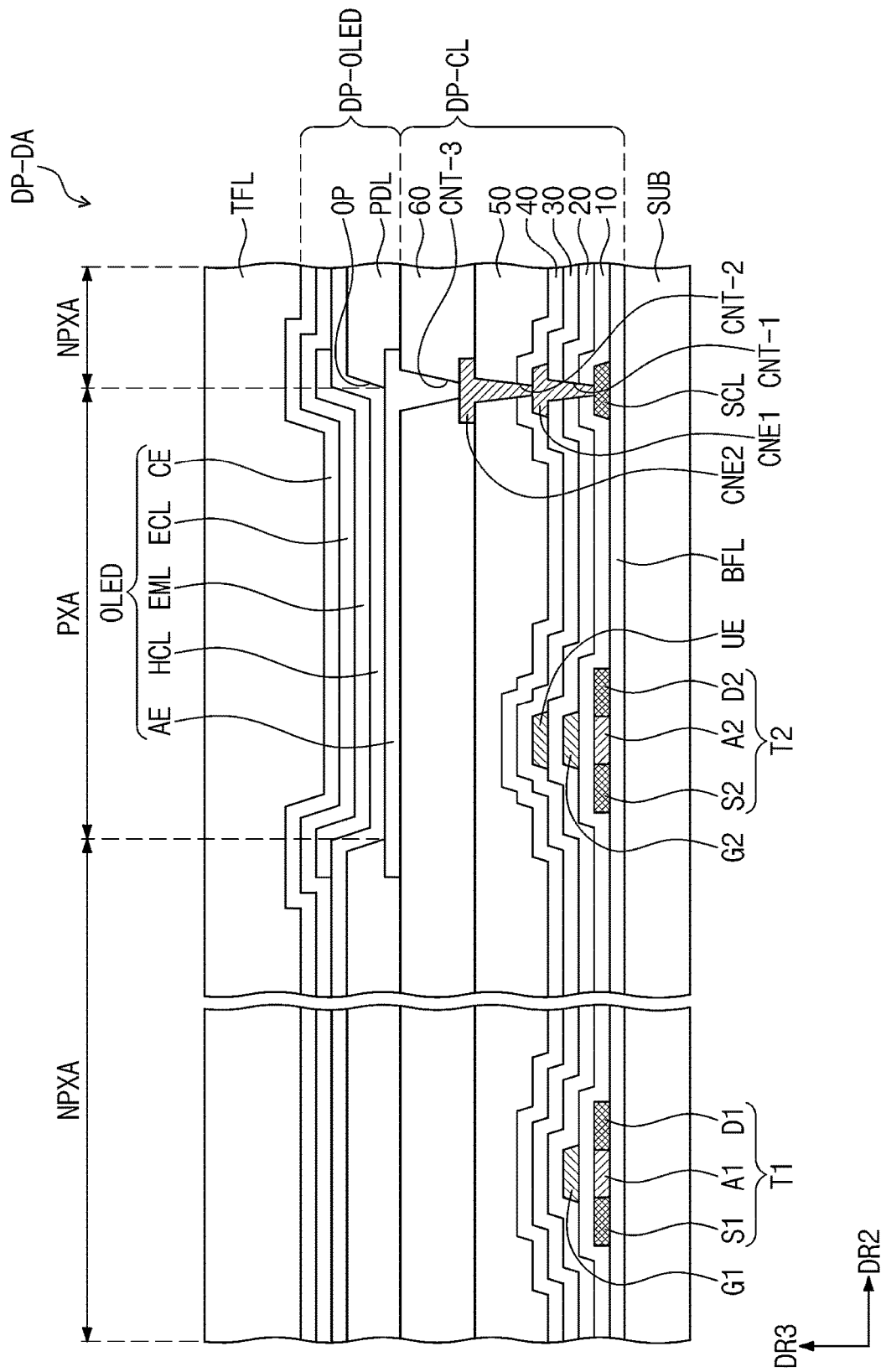
FIG. 4B illustrates a cross-sectional view partially showing an embodiment of a display panel that overlaps a display area according to the invention.

FIG. 3 illustrates a plan view showing an embodiment of a display panel according to the invention. FIG. 4A illustrates an equivalent circuit diagram of an embodiment of a pixel shown in FIG. 3. FIG. 4B illustrates a cross-sectional view partially showing an embodiment of a display panel that overlaps a display area according to the invention.

Referring to FIG. 3, the display panel DP may include a driver circuit GDC, a plurality of signal lines SGL, a plurality of pads DP-PD, a plurality of connection pads DP-CPD, and a plurality of pixels PX.

The pixels PX are disposed on the display area DP-DA. Each of the pixels PX includes an organic light emitting diode and a pixel driver circuit that is connected to the organic light emitting diode. The driver circuit GDC, the signal lines SGL, the pads DP-PD, the connection pads DP-CPD, and the pixel driver circuit may be included in the circuit element layer DP-CL illustrated in FIG. 2.

In this description, the display panel DP may be explained as a display substrate, and the display substrate may include the base substrate SUB and the plurality of pads DP-PD and the plurality of connection pads DP-CPD disposed on the base substrate SUB.

The driver circuit GDC sequentially outputs gate signals to a plurality of gate lines GL. The driver circuit GDC may further output different control signals to the pixels PX. The driver circuit GDC may include a plurality of thin film transistors provided by, for example, one of a low temperature polycrystalline silicon ("LTPS") process and a low temperature polycrystalline oxide ("LTPO") process that are the same as a process used to form driver circuits for the pixels PX.

The signal lines SGL include gate lines GL, data lines DL, a power line PL, and a control signal line CSL. Each of the gate lines GL is connected to a corresponding one of the pixels PX, and each of the data lines DL is connected to a corresponding one of the pixels PX. The power line PL is connected to the pixels PX. The control signal line CSL may provide a scan driver circuit with control signals.

The signal lines SGL overlap the display area DP-DA and the non-display area DP-NDA. Each of the signal lines SGL may include a pad part and a line part. The line part overlaps the display area DP-DA and the non-display area DP-NDA. The pad part is connected to a distal end of the line part. The pad part may overlap the non-display area DP-NDA. In the description, it is explained that the signal line SGL includes the line part and the pad part, but the line part and the pad part may be provided in individual components.

According to the invention, the non-display area DP-NDA includes a chip area NDA-CA that the pads DP-PD overlap and a connection pad area NDA-PA that the connection pads DP-CPD overlap. According to the invention, the chip area NDA-CA may be a zone on which the driver chip DC illustrated in FIG. 1B is disposed (e.g., mounted), and the connection pad area NDA-PA may be a zone on which a portion of the circuit board PB illustrated in FIG. 1B is disposed (e.g., mounted).

In an embodiment, the chip area NDA-CA includes a first pad area SA1 and a second pad area SA2 that are spaced apart from each other in the first direction DR1, for example. Although not shown, a non-pad area may be defined to refer to a zone between the first pad area SA1 and the second pad area SA2.

The pads DP-PD are electrically connected to the driver chip DC, and provide the signal lines SGL with electrical signals received from the driver chip DC. In an embodiment, the pads DP-PD include first pads DP-PD1 that overlap the first pad area SA1 and second pads DP-PD2 that overlap the second pad area SA2, for example.

The first pads DP-PD1 may be arranged along the second direction DR2 at a first interval, and may be disposed on the base substrate SUB while overlapping the first pad area SA1. In an embodiment, the first pads DP-PD1 may include pads in plural rows that are divided in the first direction DR1, for example. The second pads DP-PD2 may be arranged along the second direction DR2 at a second interval, and may be disposed on the base substrate SUB while overlapping the second pad area SA2.

According to that shown in FIG. 3, the first pads DP-PD1 may include first-row pads and second-row pads divided in the first direction DR1 from the first-row pads, and the second pads DP-PD2 may include single-row pads. As such, the number of the first pads DP-PD1 corresponds to the number of the signal lines SGL, and thus the number of the first pads DP-PD1 may be greater than the number of the second pads DP-PD2.

According to the invention, the second pads DP-PD2 may correspond to input pads that are electrically connected to corresponding connection pads DP-CPD, and the first pads DP-PD1 may correspond to output pads that are electrically connected to corresponding signal lines SGL. In an embodiment, the first pads DP-PD1 may correspond to corresponding pad parts of the signal lines SGL described above, for example.

The connection pads DP-CPD may be arranged along the second direction DR2 at a regular interval, and may be disposed on the base substrate SUB while overlapping the connection pad area NDA-PA. Ones of the connection pads DP-CPD may be electrically connected to corresponding second pads DP-PD2 disposed in the second pad area SA2, and remaining ones of the connection pads DP-CPD may be electrically connected to corresponding signal lines SGL. In an embodiment, one of the connection pads DP-CPD is connected to the control signal line CSL, for example.

The circuit board PB includes circuit pads PB-PD in electrical contact with corresponding connection pads DP-CPD such that circuit pads PB-PD and corresponding connection pads DP-CPD face each other in the third direction DR3. The circuit pads PB-PD may be disposed in a circuit pad area NDA-PCA defined in the circuit board PB.

Referring to FIG. 4A, the display area DP-DA may be defined to refer to a zone where the pixels PX are disposed. Each of the pixels PX includes an organic light emitting diode OLED and a pixel driver circuit that is connected to the organic light emitting diode OLED.

In an embodiment, the pixel PX may include a first transistor T1, a second transistor T2, a capacitor CP, and an organic light emitting diode OLED, for example. It is sufficient that the pixel driver circuit includes a switching transistor and a driver transistor, but the invention is not limited to the embodiment shown in FIG. 4A. According to that illustrated in FIG. 4A, the first transistor T1 and the second transistor T2 are illustrated as p-channel (+) metal-oxide-semiconductor ("PMOS") transistors, but the first transistor T1 and the second transistor T2 may be provided in the type of n-channel (−) metal-oxide-semiconductor ("NMOS") transistor.

The first transistor T1 is connected to the gate line GL and the data line DL. The organic light emitting diode OLED receives a first power voltage ELVDD and a second power voltage ELVSS that are provided from the power line PL. The first power voltage ELVDD is provided through the second transistor T2 to a first electrode of the organic light emitting diode OLED, and the second power voltage ELVSS is provided to a second electrode of the organic light emitting diode OLED. The second power voltage ELVSS may be less than the first power voltage ELVDD.

Referring to FIG. 4B, the display panel DP may include a plurality of dielectric layers, a semiconductor pattern, a conductive pattern, and a signal line. A dielectric layer, a semiconductor layer, and a conductive layer are provided by coating or deposition. Afterwards, the dielectric layer, the semiconductor layer, and the conductive layer may be selectively patterned by photolithography. The processes mentioned above may form the semiconductor pattern, the conductive pattern, and the signal line that are included in the circuit element layer DP-CL and the display element layer DP-OLED. In explaining the display panel DP shown in FIG. 4B, the pixel driver circuit illustrated in FIG. 4A includes additional elements other than the first transistor T1 and the second transistor T2. The base substrate SUB may support the circuit element layer DP-CL and the display element layer DP-OLED.

In an embodiment, the base substrate SUB may include a synthetic resin film. The synthetic resin film may include a thermosetting resin, for example. The base substrate SUB may have a multi-layered structure. In an embodiment, the base substrate SUB may have a tri-layered structure including a synthetic resin layer, an adhesive layer, and a synthetic resin layer, for example. In an embodiment, the synthetic resin layer may be a polyimide-based resin layer, and is not especially limited in its material, for example. In an embodiment, the synthetic resin layer may include one or more of acryl-based resin, methacryl-based resin, polyisoprene, vinyl-based resin, epoxy-based resin, urethane-based resin, cellulose-based resin, siloxane-based resin, polyamide-based resin, and perylene-based resin, for example. In an alternative embodiment, the base substrate SUB may include one or more of a glass substrate, a metal substrate, and an organic/inorganic composite material substrate.

At least one inorganic layer may be disposed on a top surface of the base substrate SUB. In an embodiment, the inorganic layer may include one or more of aluminum oxide, titanium oxide, silicon oxide, silicon oxynitride, zirconium oxide, and hafnium oxide, for example. The inorganic layer may be multi-layered. The multi-inorganic layers may constitute a barrier layer and/or a buffer layer. In the illustrated embodiment, the display panel DP is illustrated to include a buffer layer BFL.

The buffer layer BFL may increase a bonding force between the base substrate SUB and a semiconductor pattern. The buffer layer BFL may include a silicon oxide layer and a silicon nitride layer. The silicon oxide layer and the silicon nitride layer may be alternately stacked.

A semiconductor pattern is disposed on the buffer layer BFL. The semiconductor pattern may include polysilicon.

The invention, however, is not limited thereto, and the semiconductor pattern may include amorphous silicon or metal oxide.

FIG. 4B shows only an example of the semiconductor pattern, and in a plan view, the semiconductor pattern may further be disposed on a different area of the pixel PX. The semiconductor pattern may be specifically arranged over the pixels PX. The semiconductor pattern may have its electrical property that is different based on whether the semiconductor pattern is doped or not. The semiconductor pattern may include a doped area and an undoped area. The doped area may be implanted with n-type or p-type impurities. A p-type transistor includes a doped area implanted with p-type impurities.

The doped area has greater conductivity than that of the undoped area, and substantially serves as an electrode or a signal line. The undoped area substantially corresponds to an active (or channel) of a transistor. In an embodiment, a portion of the semiconductor pattern may be an active of a transistor, another portion of the semiconductor pattern may be a source or drain of the transistor, and still another portion of the semiconductor pattern may be a connection electrode or a connection signal line, for example.

As shown in FIG. 4B, a source S1, an active A1, and a drain D1 of the first transistor T1 include the semiconductor pattern, and a source S2, an active A2, and a drain D2 of the second transistor T2 include the semiconductor pattern. When viewed in cross-section, the source S1 and the drain D1 extend in opposite directions from the active A1, and likewise, the source S2 and the drain D2 extend in opposite directions from the active A2. FIG. 4B partially shows a connection signal line SCL including the semiconductor pattern. Although not shown, in a plan view, the connection signal line SCL may be connected to the drain D2 of the second transistor T2.

A first dielectric layer 10 is disposed on the buffer layer BFL. The first dielectric layer 10 commonly overlaps a plurality of pixels PX and covers the semiconductor pattern. The first dielectric layer 10 may be an inorganic layer and/or an organic layer, and may have a single-layered or multi-layered structure. In an embodiment, the first dielectric layer 10 may include one or more of aluminum oxide, titanium oxide, silicon oxide, silicon oxynitride, zirconium oxide, and hafnium oxide, for example. In the illustrated embodiment, the first dielectric layer 10 may be a single-layered silicon oxide layer. Likewise the first dielectric layer 10, a dielectric layer of the circuit element layer DP-CL may be an inorganic layer and/or an organic layer, and may have a single-layered or multi-layered structure. The inorganic layer may include one or more of the materials mentioned above.

Gates G1 and G2 are disposed on the first dielectric layer 10. Each of the gates G1 and G2 may be a portion of a metal pattern. The gates G1 and G2 respectively overlap the actives A1 and A2. The gates G1 and G2 may serve as a mask in a process in which the semiconductor pattern is doped.

A second dielectric layer 20 that covers the gates G1 and G2 is disposed on the first dielectric layer 10. The second dielectric layer 20 commonly overlaps the pixels PX. The second dielectric layer 20 may be an inorganic layer and/or an organic layer, and may have a single-layered or multi-layered structure. In the illustrated embodiment, the second dielectric layer 20 may be a single-layered silicon oxide layer.

An upper electrode UE may be disposed on the second dielectric layer 20. The upper electrode UE may overlap the gate G2 of the second transistor T2. The upper electrode UE may be a portion of a metal pattern. The capacitor (refer to CP of FIG. 4A) may be defined by a portion of the gate G2 and the upper electrode UE that overlaps the portion of the gate G2.

A third dielectric layer 30 that covers the upper electrode UE is disposed on the second dielectric layer 20. In the illustrated embodiment, the third dielectric layer 30 may be a single-layered silicon oxide layer. A first connection electrode CNE1 may be disposed on the third dielectric layer 30. The first connection electrode CNE1 may be coupled to the connection signal line SCL through a contact hole CNT-1 that penetrates the first, second, and third dielectric layers 10, 20, and 30.

A fourth dielectric layer 40 that covers the first connection electrode CNE1 is disposed on the third dielectric layer 30. The fourth dielectric layer 40 may be a single-layered silicon oxide layer. A fifth dielectric layer 50 is disposed on the fourth dielectric layer 40. The fifth dielectric layer 50 may be an organic layer. A second connection electrode CNE2 may be disposed on the fifth dielectric layer 50. The second connection electrode CNE2 may be coupled to the first connection electrode CNE1 through a contact hole CNT-2 that penetrates the fourth and fifth dielectric layers 40 and 50.

A sixth dielectric layer 60 that covers the second connection electrode CNE2 is disposed on the fifth dielectric layer 50. The sixth dielectric layer 60 may be an organic layer. A first electrode AE is disposed on the sixth dielectric layer 60. The first electrode AE is connected to the second connection electrode CNE2 through a contact hole CNT-3 that penetrates the sixth dielectric layer 60. An opening OP is defined in a pixel definition layer PDL. The opening OP of the pixel definition layer PDL exposes at least a portion of the first electrode AE.

As shown in FIG. 4B, the display area DP-DA may include an emission area PXA and a shield area NPXA adjacent to the emission area PXA. The shield area NPXA may surround the emission area PXA. In the illustrated embodiment, the first electrode AE includes a portion exposed to the opening OP, and the emission area PXA is defined to correspond to the portion of the first electrode AE.

A hole control layer HCL may be disposed in common in the emission area PXA and the shield area NPXA. The hole control layer HCL may include a hole transport layer and may further include a hole injection layer. An emission layer EML is disposed on the hole control layer HCL. The emission layer EML may be disposed in an area that corresponds to the opening OP. In an embodiment, the emission layer EML may be disposed on each of the pixels (refer to PX of FIG. 4A), for example.

An electron control layer ECL is disposed on the emission layer EML. The electron control layer ECL may include an electron transport layer and may further include an electron injection layer. An open mask may be used such that the hole control layer HCL and the electron control layer ECL are provided in common on a plurality of pixels PX. A second electrode CE is disposed on the electron control layer ECL. The second electrode CE has a single unitary shape and is disposed on a plurality of pixels PX.

A dielectric layer TFL is disposed on the second electrode CE. The dielectric layer TFL may include a plurality of thin layers.

Figure 5A:
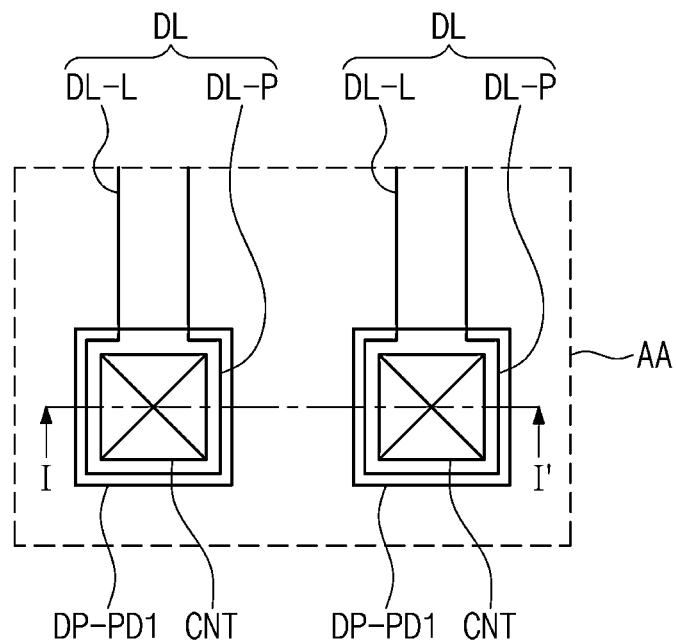
FIG. 5A illustrates an enlarged view showing section AA of FIG. 3.
Figure 5B:
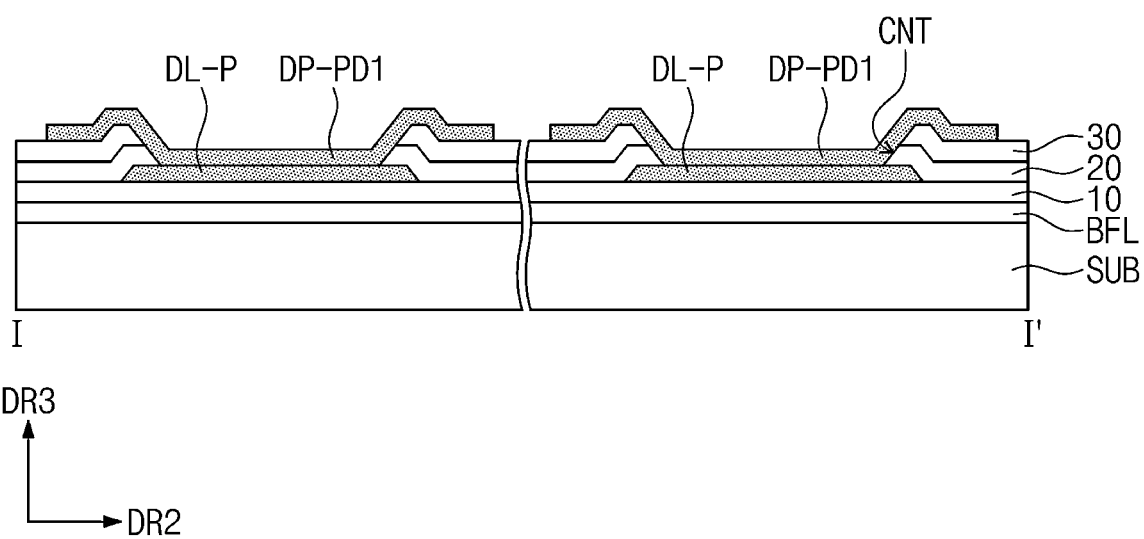
FIG. 5B illustrates a cross-sectional view taken along line I-I' of FIG. 5A.

FIG. 5A illustrates an enlarged view showing section AA of FIG. 3. FIG. 5B illustrates a cross-sectional view taken along line I-I' of FIG. 5A.

FIG. 5A exemplarily shows line parts DL-L and pad parts DL-P of two of the data lines DL. FIG. 5A also exemplarily shows two first pads DP-PD1 that are electrically coupled to corresponding pad parts DL-P positioned on the preceding row. The pad parts DL-P may each have an area per unit length greater than an area per unit length of each of the line parts DL-L. The pad parts DL-P are each illustrated to have a tetragonal shape, but the shapes of the pad parts DL-P may be changed in process procedures.

According to the invention, the first and second pads DP-PD1 and DP-PD2 may have the structures described with reference to FIGS. 5A and 5B.

Referring to FIG. 5B, the pad parts DL-P of the date lines DL may be disposed on the second dielectric layer 20. The third dielectric layer 30 may cover the pad parts DL-P of the data lines DL. The first pads DP-PD1 are disposed on the third dielectric layer 30. Contact holes CNT are defined in the third dielectric layer 30 to expose corresponding pad parts DL-P. Each of the first pads DP-PD1 may be in electrical contact with a corresponding one of the pad parts DL-P through the contact hole CNT that penetrates the third dielectric layer 30.

Figure 6:
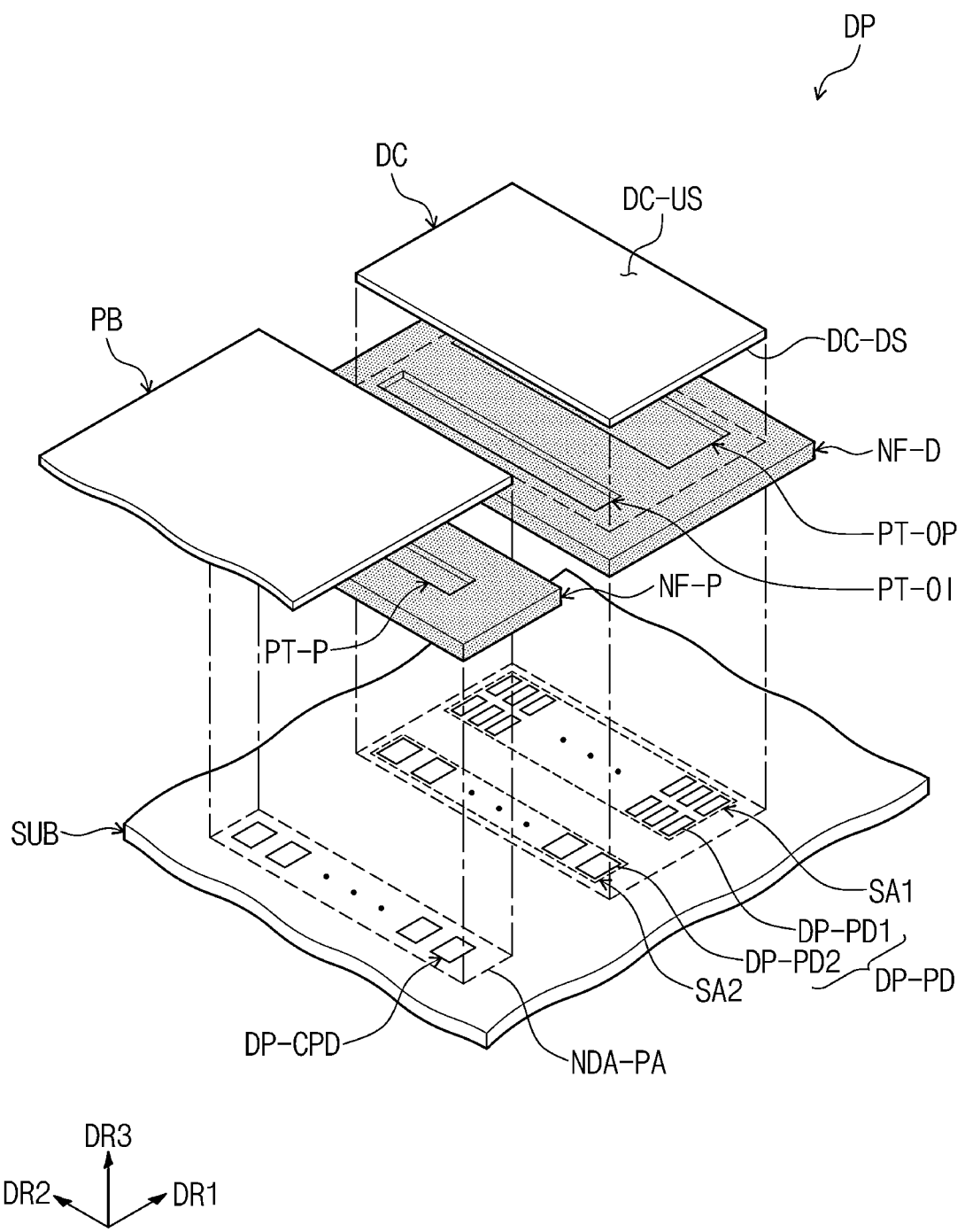
FIG. 6 illustrates an exploded perspective view showing an embodiment of a display device according to the invention.
Figure 7:
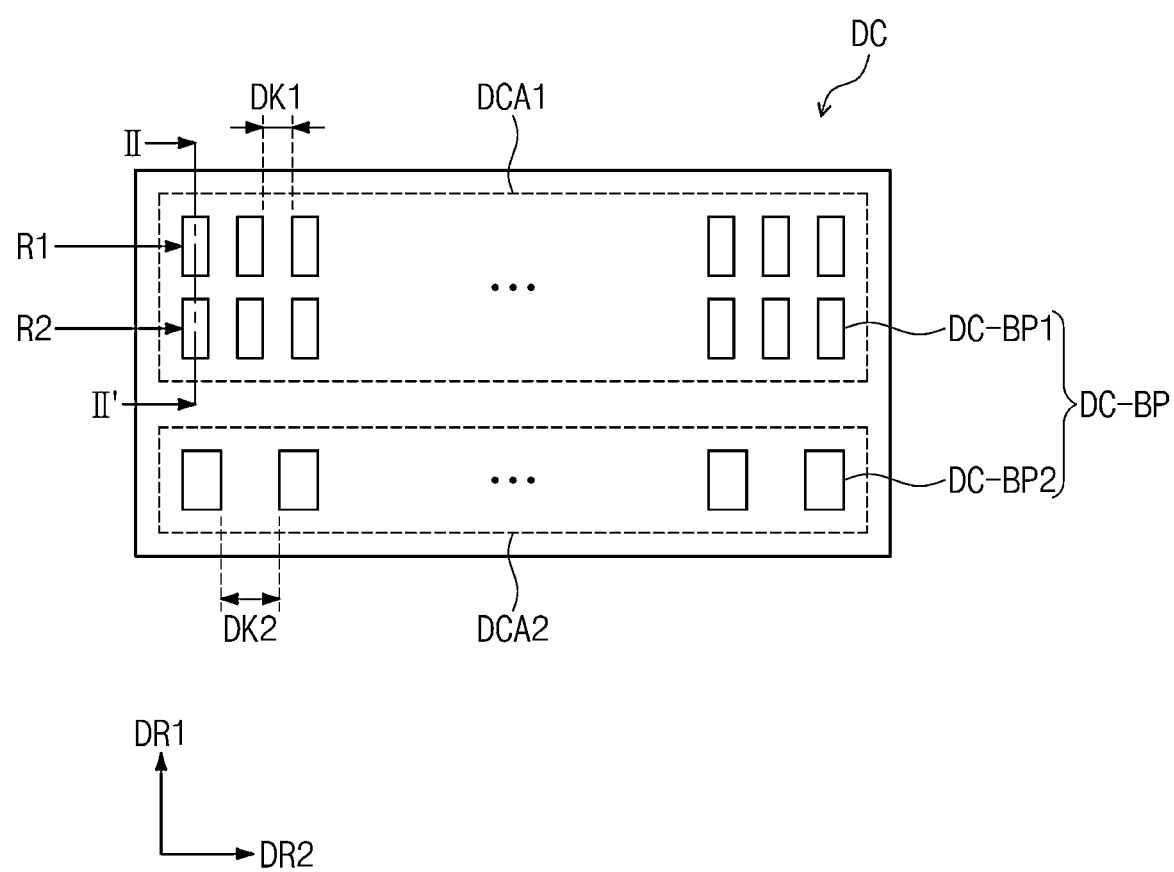
FIG. 7 illustrates a plan view showing an embodiment of an electronic component according to the invention.
Figure 8A:
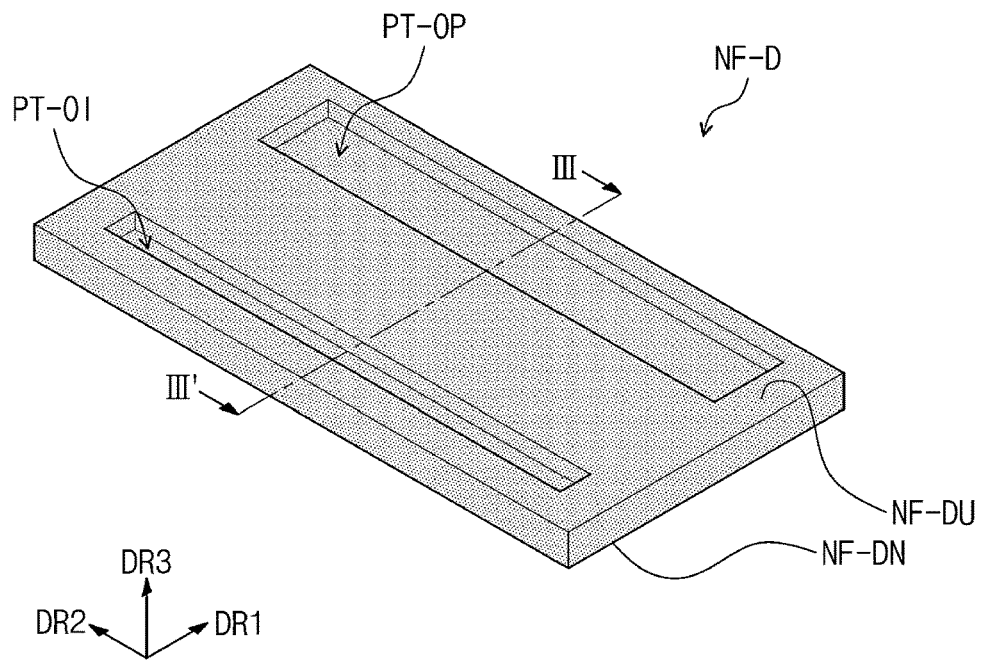
FIG. 8A illustrates a perspective view showing an embodiment of a first adhesive member according to the invention.
Figure 8B:
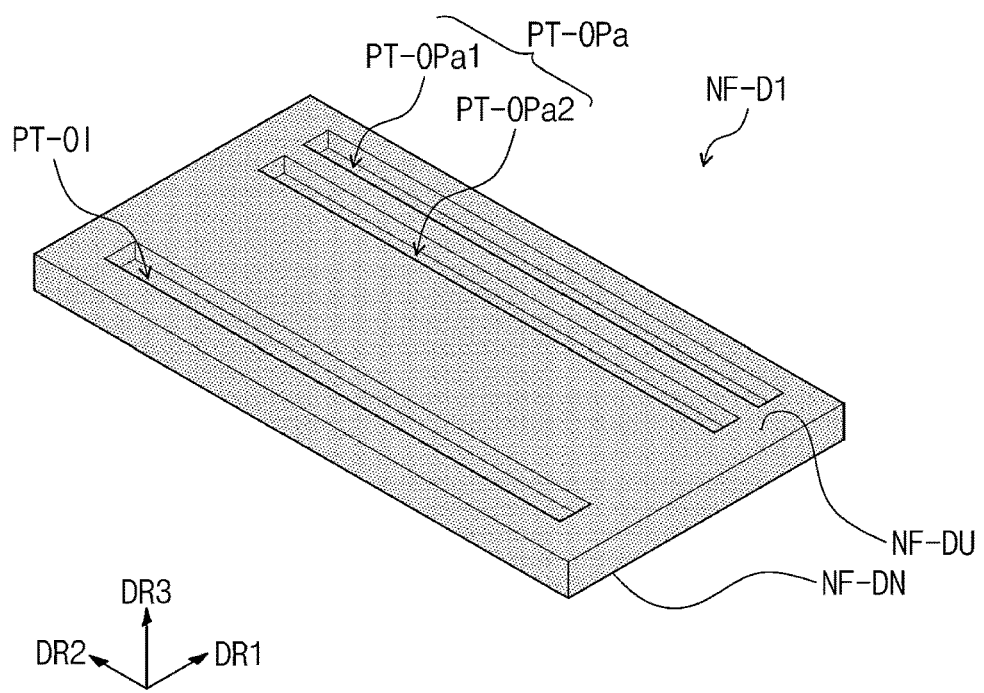
FIG. 8B illustrates a perspective view showing an embodiment of a first adhesive member according to the invention.

FIG. 6 illustrates an exploded perspective view showing an embodiment of a display device according to the invention. FIG. 7 illustrates a plan view showing an embodiment of an electronic component according to the invention. FIG. 8A illustrates a perspective view showing an embodiment of a first adhesive member according to the invention. FIG. 8B illustrates a perspective view showing an embodiment of a first adhesive member according to the invention. As described above with reference to FIG. 1B, the driver chip DC will be explained as an electronic component described below, and the same reference symbol "DC" will be commonly used herein to denote the driver chip or the electronic component.

Referring to FIG. 6, the display panel DP may further include a first adhesive member NF-D and a second adhesive member NF-P. The first adhesive member NF-D may be disposed between the electronic component DC and the base substrate SUB, thereby attaching the electronic component DC to the base substrate SUB. The second adhesive member NF-P may be disposed between the circuit board PB and the base substrate SUB, thereby attaching the circuit board PB to the base substrate SUB. In an embodiment, in a plan view, the first adhesive member NF-D may surround the electronic component DC, for example.

In some embodiments, each of the first and second adhesive members NF-D and NF-P may have non-conductive characteristics, and may be provided in the type of an adhesive resin including a thermal initiator. The first and second adhesive members NF-D and NF-P may have curing characteristics that are changed depending on external heat.

The driver chip DC includes a top surface DC-US and a bottom surface DC-DS that faces the first adhesive member NF-D. In an embodiment, referring to FIG. 7, the driver chip DC may include a plurality of bumps DC-BP in electrical contact with corresponding pads DP-PD disposed on the base substrate SUB, for example.

The driver chip DC includes a first bump area DCA1 that corresponds to the first pad area SA1 illustrated in FIG. 3 and a second bump area DCA2 that corresponds to the second pad area SA2 illustrated in FIG. 3. The bumps DC-BP may include first bumps DC-BP1 that overlap the first bump area DCA1 and second bumps DC-BP2 that overlap the second bump area DCA2.

The first bumps DC-BP1 may include first-row bumps and second-row bumps which are arranged in two rows R1 and R2 and which correspond to the first pads DP-PD1. The second bumps DC-BP2 may include bumps which are arranged in a single row and which correspond to the second pads DP-PD2. As a result, in a plan view, the first bump area DCA1 may have an area greater than that of the second bump area DCA2.

A first interval DK1 between two first bumps DC-BP1 that neighbor in the second direction DR2 may be less than a second interval DK2 between two second bumps DC-BP2 that neighbor in the second direction DR2. In an embodiment, along the second direction DR2, the second interval DK2 may be greater than the first interval DK1, for example.

As such, the number of the first bumps DC-BP1 is greater than the number of the second bumps DC-BP2, and thus the second interval DK2 between the second bumps DC-BP2 may be set to be greater than the first interval DK1 between the first bumps DC-BP 1.

In addition, in a plan view, one of the first bumps DC-BP1 may have an area different from that of one of the second bumps DC-BP2. In an embodiment, according to that shown in FIG. 7, each of the second bumps DC-BP2 is illustrated to have an area greater than that of each of the first bumps DC-BP1, for example.

Likewise, as shown in FIG. 6, a first interval between two first pads DP-PD1 that neighbor in the second direction DR2 may be less than a second interval between two second pads DP-PD2 that neighbor in the second direction DR2. In an embodiment, along the second direction DR2, the second interval may be greater than the first interval, for example.

As such, the first pads DP-PD1 and the first bumps DC-BP1 face each other and are in electrical contact with each other in the third direction DR3, and thus an interval between two neighboring first pads DP-PD1 may substantially correspond to an interval between two neighboring first bumps DC-BP1. In addition, the second pads DP-PD2 and the second bumps DC-BP2 face each other and are in electric contact with each other in the third direction DR3, and thus an interval between two neighboring second pads DP-PD2 may substantially correspond to an interval between two neighboring second bumps DC-BP2.

Moreover, in a plan view, an area of one of the first pads DP-PD1 may be different from an area of one of the second pads DP-PD2. In an embodiment, the area of each of the second pads DP-PD2 may be greater than the area of each of the first pads DP-PD1, for example.

Referring back to FIG. 6, because the pads DP-PD and the bumps DC-BP are covered with the first adhesive member NF-D, the pads DP-PD and the bumps DC-BP may be isolated from external air. As a result, it may be possible to prevent the bumps DC-BP and the pads DP-PD from being oxidized by external air.

The circuit pads (refer to PB-PD of FIG. 3) of the circuit board PB may face in the third direction DR3 with the connection pads DP-CPD, and may be electrically connected to corresponding connection pads DP-CPD. According to the invention, because the circuit pads PB-PD and the connection pads DP-CPD are covered with the second adhesive member NF-P, the circuit pads PB-PD and the connection pads DP-CPD may be isolated from external air. As a result, it may be possible to prevent the circuit pads PB-PD and the connection pads DP-CPD from being oxidized by external air.

According to the invention, the first adhesive member NF-D may be disposed between the pads DP-PD and the bumps DC-BP before electrical contact is established between the pads DP-PD and the bumps DC-BP. Likewise, the second adhesive member NF-P may be disposed between the circuit pads PB-PD and the connection pads DP-CPD before electrical contact is established between the circuit pads PB-PD and the connection pads DP-CPD.

In some embodiments, an ultrasonic bonding method may be employed to thermally compress the pads DP-PD and the bumps DC-BP against each other. In this case, the first adhesive member NF-D between the pads DP-PD and the bumps DC-BP may migrate into another space during the process in which the pads DP-PD and the bumps DC-BP are thermally compressed against each other. In this description, the another space may mean a gap which is provided between the base substrate SUB and the driver chip DC and which does not overlap the pads DP-PD and the bumps DC-BP. In an embodiment, the another space may correspond to a non-pad area between the pads DP-PD or between the first pad area SA1 and the second pad area SA2, for example.

In some embodiments, the ultrasonic bonding method may thermally compress the connection pads DP-CPD and the circuit pads PB-PD against each other. Likewise, the second adhesive member NF-P between the connection pads DP-CPD and the circuit pads PB-PD may migrate into another space during the process in which the connection pads DP-CPD and the circuit pads PB-PD are thermally compressed against each other.

As described above, each of the first and second adhesive members NF-D and NF-P according to the invention may be provided in the type of film. In this case, the first adhesive member NF-D may have a thickness suitable for adhesion between the driver chip DC and the base substrate SUB. In addition, the second adhesive member NF-P may have a thickness suitable for adhesion between the circuit board PB and the base substrate SUB.

In contrast, when an entirety of a first adhesive member has the same or substantially the same thickness, the first adhesive member may remain between pads and bumps even after the compression process based on the ultrasonic bonding method. In such cases, no electrical contact between the pad and the bump may be established due to the first adhesive member that remains between the pad and the bump after the compression process.

According to some embodiments of the invention, along the third direction DR3, the first adhesive member NF-D may have a thickness that overlaps the first pad area SA1 less than a thickness thereof that overlaps the non-pad area between the first pad area SA1 and the second pad area SA2. When viewed along the third direction DR3, the first adhesive member NF-D may have a thickness that overlaps the second pad area SA2 less than a thickness thereof that overlaps the non-pad area. In such cases, the first adhesive member NF-D may be provided to have a thickness that overlaps the pads DP-PD less than a thickness thereof that overlaps the non-pad area.

According to some embodiments of the invention, the second adhesive member NF-P may have a thickness that overlaps the connection pads DP-CPD less than a thickness thereof that does not overlap the connection pads DP-CPD.

In an embodiment, referring to FIG. 8A, the first adhesive member NF-D includes a top surface NF-DU and a bottom surface NF-DN, for example. According to the invention, at least one recess pattern may be defined in the first adhesive member NF-D. In an embodiment, as shown in FIG. 8A, a first recess pattern PT-OP that overlaps the first pad area SA1 and a second recess pattern PT-OI that overlaps the second pad area SA2 are defined in the first adhesive member NF-D, for example.

The first recess pattern PT-OP may entirely overlap the first pads DP-PD1, and may have a shape which is recessed downward from the top surface NF-DU and which extends in the second direction DR2. The second recess pattern PT-OI may be spaced apart in the first direction DR1 from the first recess pattern PT-OP. The second recess pattern PT-OI may entirely overlap the second pads DP-PD2, and may have a shape which is recessed downward from the top surface NF-DU and which extends in the second direction DR2.

Although the first and second recess patterns PT-OP and PT-OI are each illustrated to have a rectangular shape in a plan view, the first and second recess patterns PT-OP and PT-OI may be variously changed in shape.

In some embodiments, a sum of planar areas of the first and second recess patterns PT-OP and PT-OI may fall within a range from about 20 percent (%) to about 70% of a total planar area of the top surface NF-DU. In an embodiment, as shown in FIG. 3, the number of the first pads DP-PD1 that overlap the first recess pattern PT-OP may be greater than the number of the second pads DP-PD2 that overlap the second recess pattern PT-OI, for example. Therefore, the planar area of the first recess pattern PT-OP may be greater than the planar area of the second recess pattern PT-OI.

Compared to the first adhesive member NF-D illustrated in FIG. 8A, a first adhesive member NF-D1 depicted in FIG. 8B may be configured such that a first recess pattern PT-OPa is defined to have a shape different from that of the first recess pattern PT-OP shown in FIG. 8A, and that a second recess pattern PT-OI is defined to have a shape substantially the same as that of the second recess pattern PT-OI shown in FIG. 8A.

Referring to FIG. 8B, the first recess pattern PT-OPa includes a first sub-recess pattern PT-OPa1 and a second sub-recess pattern PT-OPa2. The second sub-recess pattern PT-OPa2 may be defined between the first sub-recess pattern PT-OPa1 and the second recess pattern PT-OI.

According to the invention, the first sub-recess pattern PT-OPa1 may overlap the first-row pads of the first pads DP-PD1 and may have a shape that extends in the second direction DR2. The second sub-recess pattern PT-OPa2 may overlap the second-row pads of the first pads DP-PD1 and may have a shape that extends in the second direction DR2.

In an embodiment, the first and second sub-recess patterns PT-OPa1 and PT-OPa2 may have shapes spaced apart from each other in the first direction DR1, for example. In the illustrated embodiment, along the first direction DR1, an interval distance between the second sub-recess pattern PT-OPa2 and the second recess pattern PT-OI is greater than an interval distance between the first sub-recess pattern PT-OPa1 and the second sub-recess pattern PT-OPa2. However, the invention is not limited thereto, and in another embodiment, along the first direction DR1, an interval distance between the second sub-recess pattern PT-OPa2 and the second recess pattern PT-OI may be less than an interval distance between the first sub-recess pattern PT-OPa1 and the second sub-recess pattern PT-OPa2.

As described above, the first adhesive member NF-D may have a thickness of a portion, which overlaps the first and second pad areas SA1 and SA2 to which the pads DP-PD and the bumps DC-BP are coupled such that the thickness of the portion of first adhesive member NF-D may be less than a thickness of other portions of the first adhesive member NF-D. Therefore, the first adhesive member NF-D between and overlapping the pads DP-PD and the bumps DC-BP may easily migrate into another space during the compression process based on the ultrasonic bonding method. As a result, the driver chip DC and the display panel DP may have improved joint reliability therebetween.

Figure 9A:
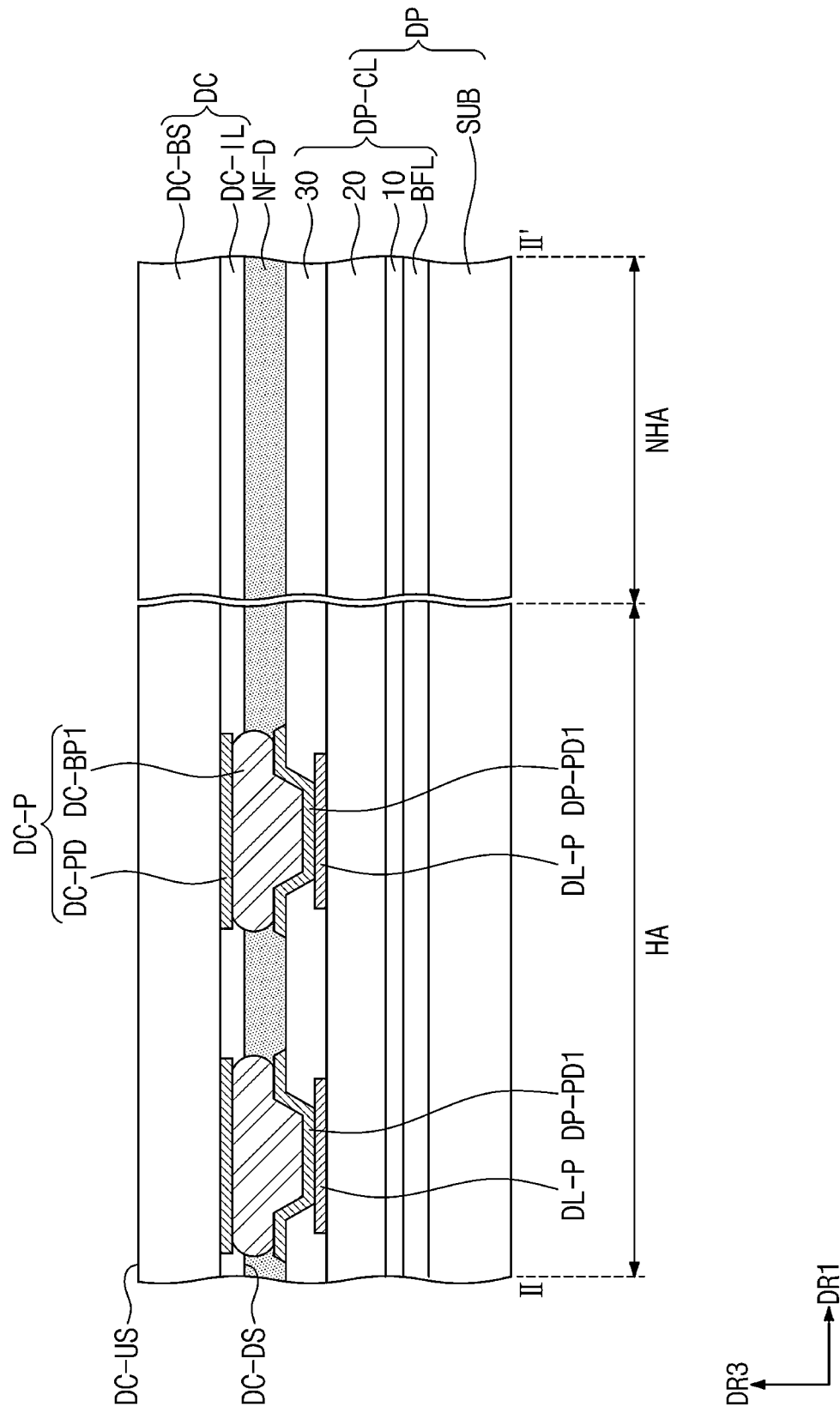
FIG. 9A illustrates a cross-sectional view of an embodiment taken along line II-II' of FIG. 7 according to the invention.
Figure 9B:
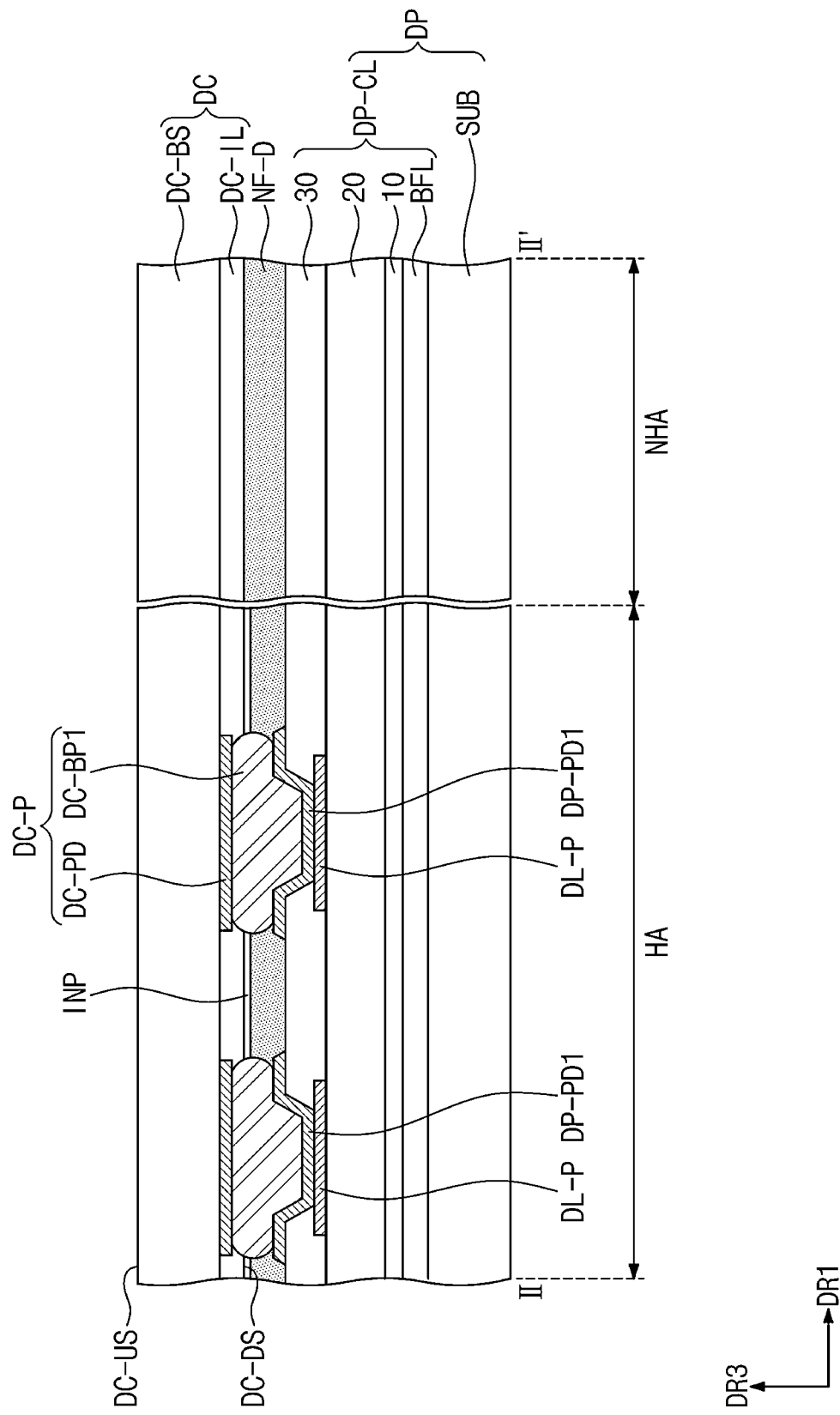
FIG. 9B illustrates a cross-sectional view of an embodiment taken along line II-II' of FIG. 7 according to the invention.

FIG. 9A illustrates a cross-sectional view of an embodiment taken along line II-II' of FIG. 7 according to the invention. FIG. 9B illustrates a cross-sectional view of an embodiment taken along line II-IF of FIG. 7 according to the invention.

Referring to FIG. 9A, the electronic component DC includes a substrate DC-BS, a drive pad part DC-P, and a pad dielectric layer DC-IL. The drive pad part DC-P includes a drive pad DC-PD and a first bump DC-BP1 (also referred to as a bump).

The substrate DC-BS may have a top surface that corresponds to the top surface DC-US of the electronic component DC. The pad dielectric layer DC-IL may have a bottom surface which faces the display panel DP and corresponds to the bottom surface DC-DS of the electronic component DC. In an embodiment, the substrate DC-BS may include silicon, for example.

The drive pad DC-PD may be disposed on a bottom surface of the substrate DC-BS. The drive pad DC-PD may be electrically connected to a circuit element (not shown) of the electronic component DC. The pad dielectric layer DC-IL may be disposed on the bottom surface of the substrate DC-BS and a through hole may be defined in the pad dielectric layer DC-IL to expose a portion of the drive pad DC-PD. The bump DC-BP1 may be directly disposed on the drive pad DC-PD.

In some embodiments, an ultrasonic bonding method may be employed to cause the bump DC-BP1 to electrically contact a first pad DP-PD1 (also referred to as a pad). In an embodiment, frictional heat generated by ultrasonic vibration occurs at an interface between the bump DC-BP1 and the pad DP-PD1, for example. In addition, thermal pressure may be externally applied to the top surface of the substrate DC-BS such that the bump DC-BP1 and the pad DP-PD1 may be attached (or welded) to each other due to frictional heat at the interface therebetween.

The first adhesive member NF-D disposed between the pad DP-PD1 and the bump DC-BP1 may migrate into a space between two neighboring ones of the pads DP-PD1 during the thermo-compression process based on the ultrasonic bonding method. In an alternative embodiment, the first adhesive member NF-D disposed between the pad DP-PD1 and the bump DC-BP1 may migrate into a space which is defined between the base substrate SUB and the driver chip DC and overlaps the non-pad area between the first pad area SA1 and the second pad area SA2.

The following will describe an example in which the first adhesive member NF-D includes a recess area HA and a non-recess area NHA with reference to FIGS. 9A and 9B. The recess area HA corresponds to the first and second pad areas SA1 and SA2 described above with reference to FIG. 6, and the non-recess area NHA corresponds to a zone other than the recess area HA of the first adhesive member NF-D. In addition, the recess area HA may correspond to the first bump area DCA1 and the second bump area DCA2 that are described above with reference to FIG. 7.

In some embodiments, a density of the first adhesive member NF-D may be less at the recess area HA than at the non-recess area NHA. The difference in density occurs because that the first adhesive member NF-D is provided to have a larger thickness at the non-recess area NHA and a smaller thickness at the recess area HA. As a result, the first adhesive member NF-D may have a smaller density at its portion that corresponds to the recess area HA and a larger density at its portion that corresponds to the non-recess area NHA. In this description, the density may mean mass per unit volume of the first adhesive member NF-D disposed between the driver chip DC and the base substrate SUB.

In addition, before the ultrasonic bonding is performed, a thickness in the third direction DR3 of the first adhesive member NF-D that overlaps the non-recess area NHA may be greater than a sum of heights of the first bump DC-BP1 and the first pad DP-PD1.

As shown in FIG. 9B, an inner space INP may be defined by two neighboring ones of the first bumps DC-BP1, the first adhesive member NF-D, and the substrate DC-BS. In an embodiment, the first adhesive member NF-D may not entirely but partially fill a gap between the first bumps DC-BP1 and between the driver chip DC and the display panel DP. Accordingly, the first adhesive member NF-D may partially cover at least one of the first bumps DC-BP1, for example.

Figure 10A:
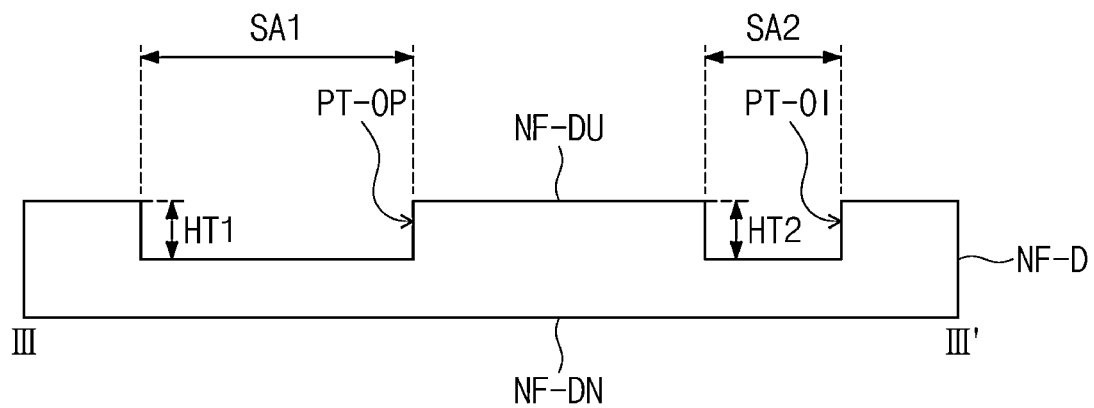
FIG. 10A illustrates a cross-sectional view of an embodiment taken along line of FIG. 8A according to the invention.
Figure 10B:
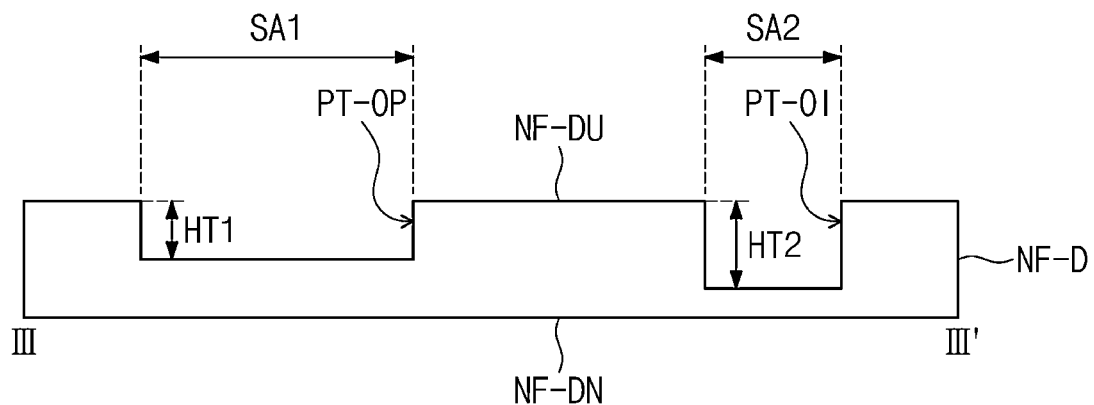
FIG. 10B illustrates a cross-sectional view of an embodiment taken along line of FIG. 8A according to the invention.
Figure 10C:
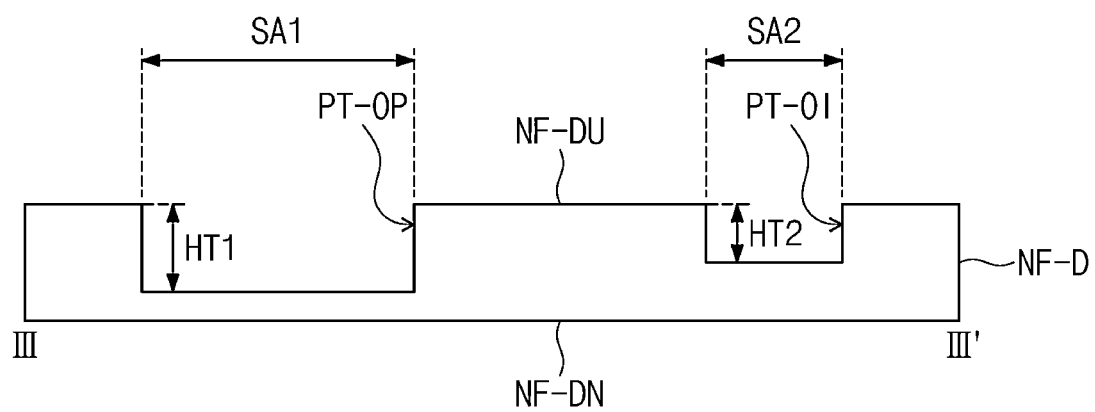
FIG. 10C illustrates a cross-sectional view of an embodiment taken along line of FIG. 8A according to the invention.

FIG. 10A illustrates a cross-sectional view of an embodiment taken along line of FIG. 8A according to the invention. FIG. 10B illustrates a cross-sectional view of an embodiment taken along line of FIG. 8A according to the invention. FIG. 10C illustrates a cross-sectional view of an embodiment taken along line of FIG. 8A according to the invention.

With reference to FIGS. 10A to 10C, the following will describe in detail various shapes of the first and second recess patterns PT-OP and PT-OI defined in the first adhesive member NF-D. The first and second recess patterns PT-OP and PT-OI, which respectively overlap the first and second pad areas SA1 and SA2, may correspond to the recess area HA described above with reference to FIG. 9A.

Referring to FIG. 10A, the first recess pattern PT-OP may have a first height HT1 in the third direction DR3, and the first height HT1 may indicate a recessed depth in the third direction DR3 from the top surface NF-DU of the first adhesive member NF-D. The second recess pattern PT-OI may have a second height HT2 in the third direction DR3, and the second height HT2 may indicate a recessed depth in the third direction DR3 from the top surface NF-DU of the first adhesive member NF-D.

In some embodiments, the first height HT1 of the first recess pattern PT-OP may be the same as the second height HT2 of the second recess pattern PT-OI. In an embodiment, the depth of the first recess pattern PT-OP recessed from the top surface NF-DU of the first adhesive member NF-D may be substantially the same as the depth of the second recess pattern PT-OI recessed from the top surface NF-DU of the first adhesive member NF-D, for example. Although the first and second heights HT1 and HT2 respectively of the first and second recess patterns PT-OP and PT-OI are illustrated as being identical to each other, the equality in height may include process tolerance.

Referring to FIGS. 10B and 10C, the first height HT1 of the first recess pattern PT-OP may be different from the second height HT2 of the second recess pattern PT-OI. In an embodiment, as shown in FIG. 10B, the second height HT2 of the second recess pattern PT-OI may be greater than the first height HT1 of the first recess pattern PT-OP, for example. In another embodiment, as shown in FIG. 10C, the first height HT1 of the first recess pattern PT-OP may be greater than the second height HT2 of the second recess pattern PT-OI.

Figure 11:
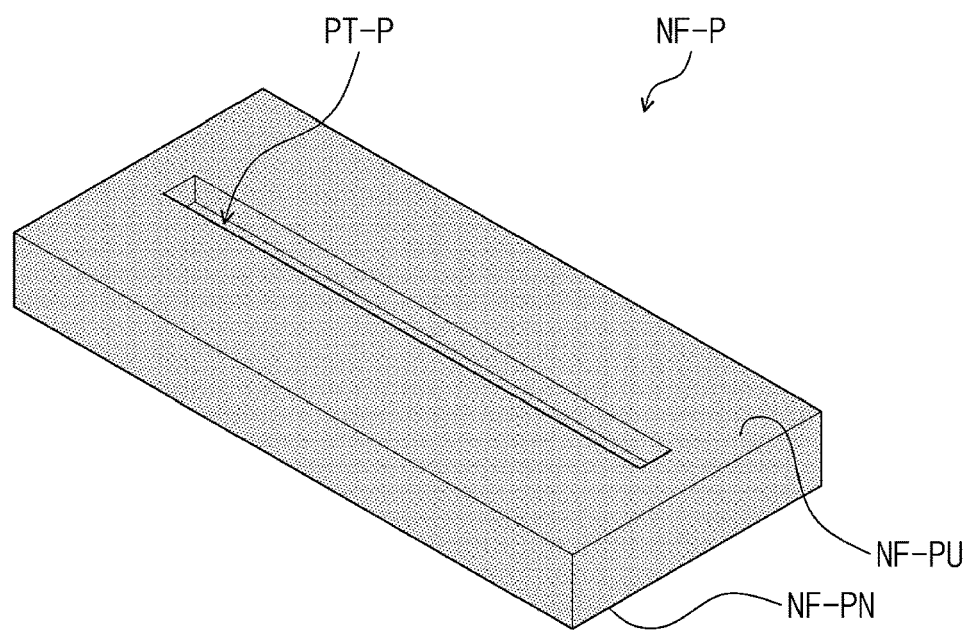
FIG. 11 illustrates a perspective view showing an embodiment of a second adhesive member according to the invention.

FIG. 11 illustrates a perspective view showing an embodiment of a second adhesive member according to the invention.

Referring to FIG. 11, the second adhesive member NF-P includes a top surface NF-PU and a bottom surface NF-PN. According to the invention, the second adhesive member NF-P overlaps the connection pad area NDA-PA illustrated in FIG. 6, and a recess pattern PT-P recessed downward from the top surface NF-PU is defined in the second adhesive member NF-P. The connection pads DP-CPD, which are disposed on the base substrate (refer to SUB of FIG. 6) and overlap the connection pad area NDA-PA, may entirely overlap the recess pattern PT-P. The recess pattern PT-P may have a shape that extends in the second direction DR2 along which the connection pads DP-CPD are arranged.

Figure 12:
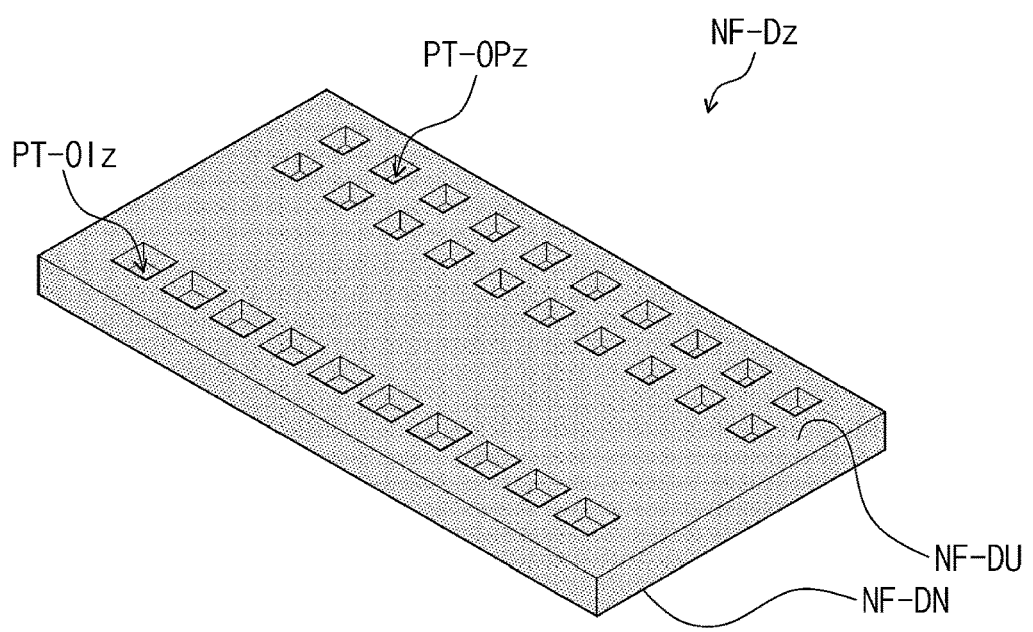
FIG. 12 illustrates a perspective view showing an embodiment of a first adhesive member according to the invention.

FIG. 12 illustrates a perspective view showing an embodiment of a first adhesive member according to the invention.

Compared to the first adhesive member NF-D illustrated in FIG. 8A, a first adhesive member NF-Dz shown in FIG. 12 defines recess patterns having shapes different from those depicted in FIG. 8A.

Referring to FIG. 12, the first adhesive member NF-Dz includes a plurality of first sub-recess patterns PT-OPz and a plurality of second sub-recess patterns PT-OIz. The plurality of first sub-recess patterns PT-OPz is arranged along the second direction DR2 at a first interval, and the plurality of second sub-recess patterns PT-OIz is arranged along the second direction DR2 at a second interval greater than the first interval. In an embodiment, the first sub-recess patterns PT-OPz may define first-row sub-recess patterns and second-row sub-recess patterns divided in the first direction DR1, for example.

According to the invention, the first sub-recess patterns PT-OPz may overlap corresponding first pads DP-PD1 that overlap the first pad area SA1 shown in FIG. 6. The second sub-recess patterns PT-OIz may overlap corresponding second pads DP-PD2 that overlap the second pad area SA2 shown in FIG. 6.

One of the first sub-recess patterns PT-OPz may have a planar area that corresponds to a planar area of a corresponding one of the first pads DP-PD1. One of the second sub-recess patterns PT-OIz may have a planar area that corresponds to a planar area of a corresponding one of the second pads DP-PD2.

Moreover, according to the invention, the planar area of one of the second sub-recess patterns PT-OIz may be greater than the planar area of one of the first sub-recess patterns PT-OPz. As such, the planar area of the second pad DP-PD2 may be greater than the planar area of the first pad DP-PD1, and thus the planar areas of the first and second sub-recess patterns PT-OPz and PT-OIz may be different from each other.

Figure 13A:
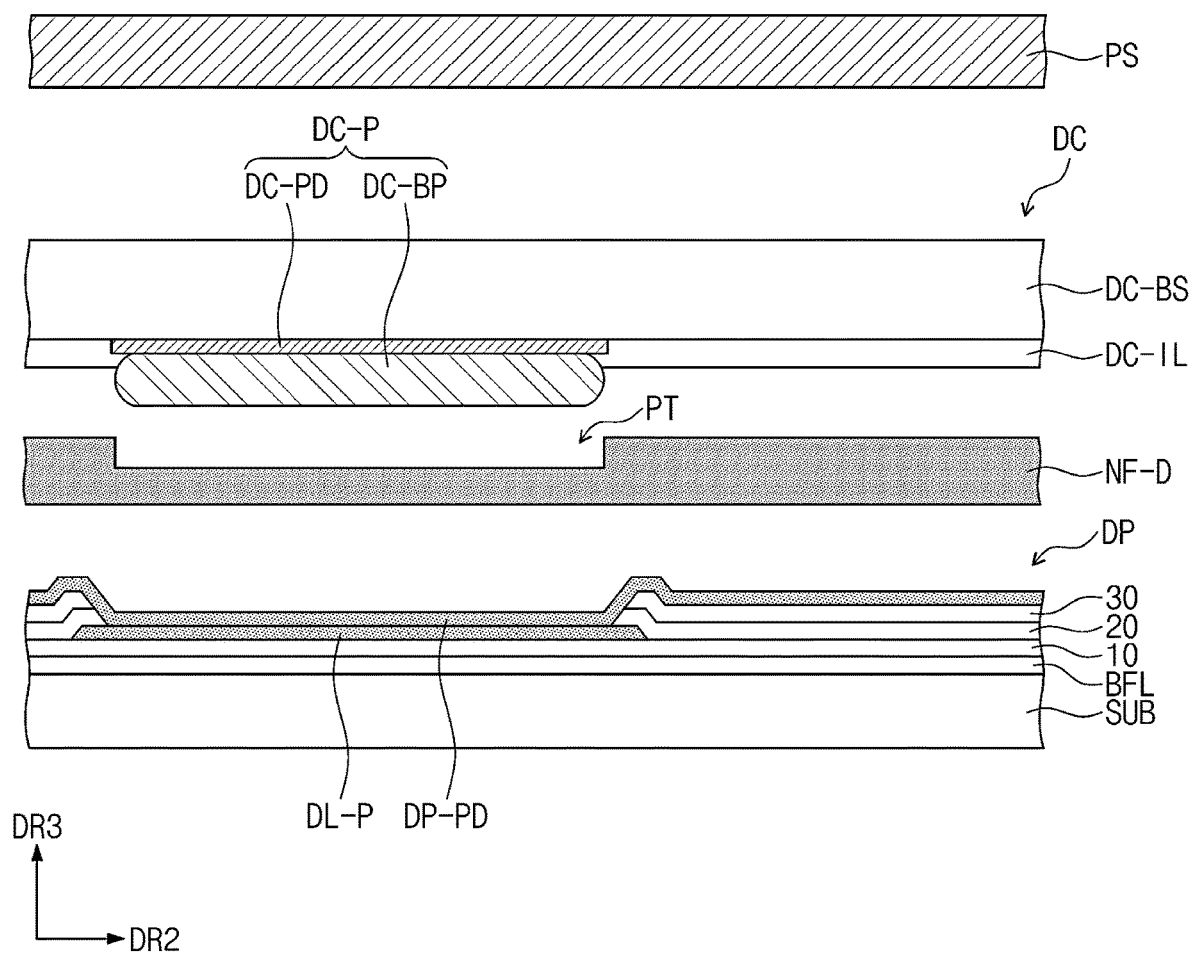
FIGS. 13A to 13C illustrate cross-sectional views showing an embodiment of a method of fabricating a display device according to the invention.
Figure 13B:
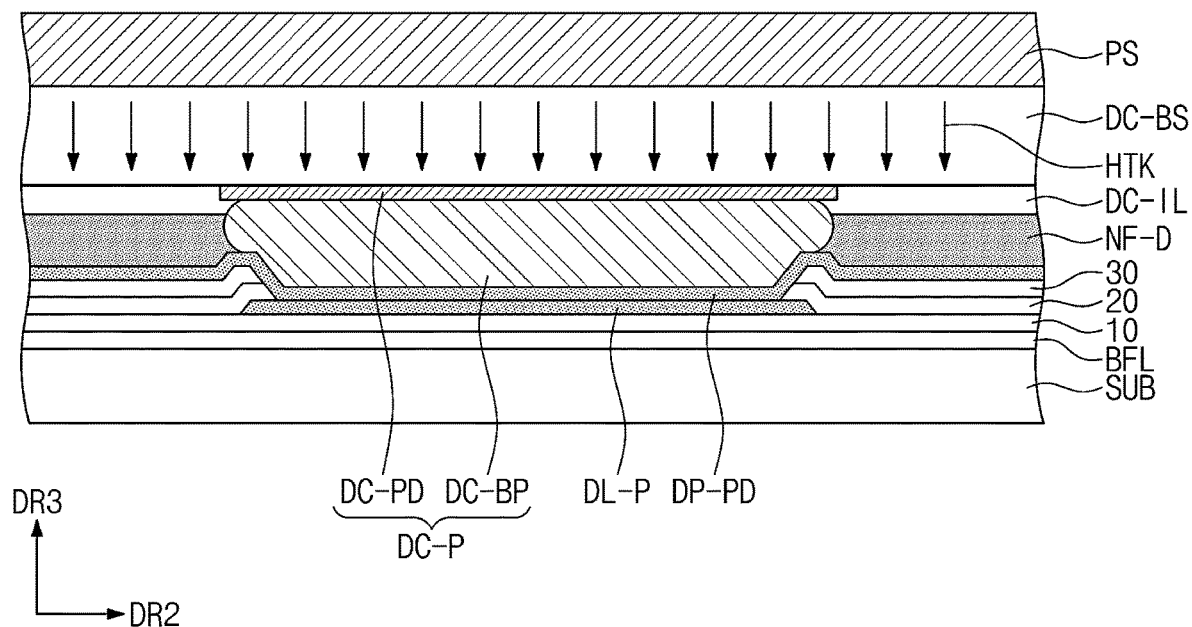
Figure 13C:
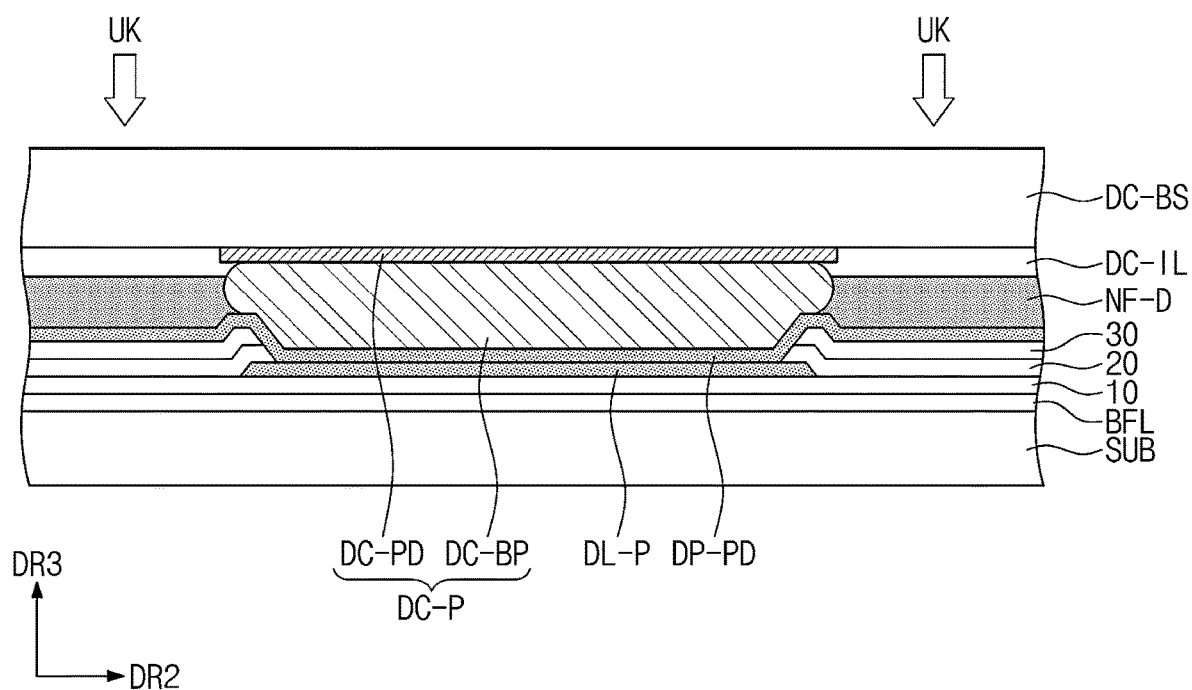

FIGS. 13A to 13C illustrate cross-sectional views showing an embodiment of a method of fabricating a display device according to the invention. Although the following description is directed toward the first adhesive member NF-D for ultrasonic bonding between the driver chip DC and the display panel DP, this description is substantially identically applicable to the second adhesive member NF-P for ultrasonic bonding between the circuit board PB and the display panel DP.

Referring to FIG. 13A, the driver chip DC (also referred to as the electronic component), the display panel DP, and the first adhesive member NF-D are prepared. The display panel DP includes the pad DP-PD, and the electronic component DC includes the bump DC-BP.

According to the invention, the first adhesive member NF-D may be disposed between the electronic component DC and the display panel DP. A recess pattern PT which overlaps the pad DP-PD and the bump DC-BP and which is recessed from the top surface NF-DU may be defined in the first adhesive member NF-D. As shown in FIG. 13A, before the pad DP-PD and the bump DC-BP are ultrasonically bonded to each other, the recess pattern PT of the first adhesive member NF-D may be aligned to overlap the pad DP-PD and the bump DC-BP.

Referring to FIG. 13B, a thermo-compression tool PS may be disposed on the electronic component DC, thereby applying thermal pressure HTK to the electronic component DC. The thermal pressure HTK applied to an upper portion of the electronic component DC may cause the bump DC-BP and the pad DP-PD to electrically contact each other. In this case, owing to physical pressure between the bump DC-BP and the pad DP-PD, the first adhesive member NF-D between and overlapping the bump DC-BP and the pad DP-PD may easily migrate into another space.

In addition, the thermo-compression tool PS may apply the thermal pressure HTK to the first adhesive member NF-D and to an interface between the bump DC-BP and the pad DP-PD. The thermal pressure HTK applied from the thermo-compression tool PS may change curing characteristics of the first adhesive member NF-D.

Afterwards, referring to FIG. 13C, ultrasonic vibration UK may be applied to the interface between the pad DP-PD and the bump DC-BP. The ultrasonic vibration UK described with reference to FIG. 13C may be applied simultaneously with the thermal pressure HTK from the thermo-compression tool PS.

According to some embodiments of the invention, a recess pattern that overlaps a pad area of a display panel is defined in an adhesive member. The adhesive member may have a smaller thickness at its portion where the recess pattern is defined and a larger thickness at its other portions where no recess pattern is defined.

Accordingly, the adhesive member disposed between a driver chip and a pad of the display panel may easily migrate into another space during a thermo-compression process based on an ultrasonic bonding method. In conclusion, it may be possible to easily establish an electrical contact between the pad and the bump and to improve joint reliability between the driver chip and the display panel.

Some embodiments have been described in the specification and drawings. Although specific terms are used herein, they are merely used for the purpose of describing the invention rather than limiting technical meanings or scopes of the invention disclosed in the claims. Therefore, it will be appreciated by a person of ordinary skill in the art that various modifications and equivalent embodiments may be made from the invention. In conclusion, the authentic technical scope of the invention to be protected shall be determined by the technical concepts.

What is claimed is:

1. An adhesive member between an electronic component and an electronic panel which are connected to each other through the adhesive member, the adhesive member comprising:
   a first surface from which a first recess pattern and a second recess pattern which is spaced apart in a first direction from the first recess pattern are recessed; and
   a second surface opposite to the first surface,
   wherein a sum of a planar area of the first recess pattern and a planar area of the second recess pattern ranges from about 20 percent to about 70 percent of a planar area of the first surface.

2. The adhesive member of claim 1, wherein a height of the first recess pattern recessed from the first surface is different from a height of the second recess pattern recessed from the first surface.

3. The adhesive member of claim 1, wherein, in a plan view, an area of the first recess pattern is different from an area of the second recess pattern.

4. The adhesive member of claim 1, wherein each of the first and second recess patterns has a shape which extends along a second direction perpendicular to the first direction.

5. The adhesive member of claim 1, wherein
the first recess pattern includes a plurality of first sub-recess patterns which are recessed from the first surface and are arranged at a first interval along a second direction perpendicular to the first direction, and
the second recess pattern includes a plurality of second sub-recess patterns which are recessed from the first surface and are arranged at a second interval along the second direction.

6. The adhesive member of claim 5, wherein a planar area of one of the plurality of second sub-recess patterns is greater than a planar area of each of the plurality of first sub-recess patterns.

7. The adhesive member of claim 5, wherein the second interval is greater than the first interval.

8. The adhesive member of claim 1, comprising a thermal initiator,
wherein the adhesive member has non-conductive characteristics and surrounds the electronic component.

9. The adhesive member of claim 1, wherein the first recess pattern includes:
a first sub-recess pattern which extends in a second direction perpendicular to the first direction; and
a second sub-recess pattern which is parallel to the second direction.

10. A display device, comprising:
a base substrate defining a display area and a non-display area adjacent to the display area, the non-display area including a first pad area, a second pad area, and a non-pad area between the first and second pad areas;
a plurality of first pads on the base substrate, the plurality of first pads overlapping the first pad area;
a plurality of second pads on the base substrate, the plurality of second pads overlapping the second pad area;
an electronic component which includes a plurality of first bumps in electrical contact with corresponding first pads of the plurality of first pads, a plurality of second bumps in electrical contact with corresponding second pads of the plurality of second pads, and a substrate on which the first bumps and the second bumps are disposed, the electronic component and the base substrate facing each other in a thickness direction of the base substrate; and
a first adhesive member between the base substrate and the electronic component, wherein an inner space is defined by the substrate, the first adhesive member, and two neighboring ones of the first bumps which overlap the first pad area,
wherein in a plan view, the adhesive member overlaps the inner space.

11. The display device of claim 10, wherein
the first pad area and the second pad area are spaced apart in a first direction across the non-pad area,
the plurality of first pads is arranged along a second direction perpendicular to the first direction, and
the plurality of second pads is arranged along the second direction.

12. The display device of claim 11, wherein
the plurality of first pads is arranged along the second direction at a first interval, and
the plurality of second pads is arranged along the second direction at a second interval,
wherein the second interval is greater than the first interval.

13. The display device of claim 11, wherein one of the plurality of second pads has a planar area greater than a planar area of each of the plurality of first pads.

14. The display device of claim 10, wherein the first adhesive member partially covers at least one of the first bumps and the second bumps.

15. The display device of claim 10, further comprising:
a plurality of connection pads which are spaced apart from the electronic component in a plan view and are disposed on the base substrate, the plurality of connection pads overlapping the non-display area;
a circuit board which overlaps the non-display area and includes a plurality of circuit pads in electrical contact with corresponding connection pads of the plurality of connection pads; and
a second adhesive member between the circuit board and the base substrate.

16. The display device of claim 15, wherein the second adhesive member partially covers at least one of the plurality of circuit pads.

17. A method of fabricating a display device, the method comprising:
providing a display panel and an electronic component, the display panel including a pad, and the electronic component including a bump facing the pad;
providing an adhesive member between the display panel and the electronic component, the adhesive member including a first surface and a second surface;
defining a recess pattern in the first surface of the adhesive member;
aligning the adhesive member to allow the recess pattern to overlap the pad and the bump;
providing the electronic component with thermal pressure to cause the bump to electrically contact the pad; and
providing ultrasonic vibration to an interface between the pad and the bump.

18. The method of claim 17, wherein the adhesive member defines a recess area which overlaps the pad and a non-recess area adjacent to the recess area,
wherein, along a thickness direction of the display panel, a thickness of the adhesive member which overlaps the non-display area is greater than a sum of a height of the pad and a height of the bump.

19. The method of claim 17, wherein a planar area of the recess pattern ranges from about 20 percent to about 70 percent of a planar area of the first surface.

20. The method of claim 17, further comprising:
defining a sub-recess pattern which is spaced apart in a predetermined direction from the recess pattern and is recessed from the first surface of the adhesive member,
wherein, along a thickness direction of the display panel, a height of the recess pattern is different from a height of the sub-recess pattern.

* * * * *